United States Patent
Vaknin et al.

(10) Patent No.: US 11,800,212 B1
(45) Date of Patent: Oct. 24, 2023

(54) MULTI-DIRECTIONAL OVERLAY METROLOGY USING MULTIPLE ILLUMINATION PARAMETERS AND ISOLATED IMAGING

(71) Applicant: KLA Corporation, Milpitas, CA (US)

(72) Inventors: Yonatan Vaknin, Yoqneam Llit (IL); Andrew V. Hill, Berkeley, CA (US); Amnon Manassen, Haifa (IL)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 17/716,757

(22) Filed: Apr. 8, 2022

(51) Int. Cl.
*H04N 23/56* (2023.01)
*G03F 7/00* (2006.01)
*G01N 21/956* (2006.01)

(52) U.S. Cl.
CPC ........... *H04N 23/56* (2023.01); *G01N 21/956* (2013.01); *G03F 7/70633* (2013.01); *G03F 7/70653* (2023.05); *G03F 7/706849* (2023.05); *G03F 7/706851* (2023.05)

(58) Field of Classification Search
CPC .. H04N 23/56; G01N 21/956; G03F 7/70633; G03F 7/70653; G03F 7/706849; G03F 7/706851
See application file for complete search history.

(56) References Cited

U.S. PATENT DOCUMENTS

| | | | |
|---|---|---|---|
| 7,433,040 B2* | 10/2008 | Mieher | G03F 9/7049 356/401 |
| 11,118,903 B2 | 9/2021 | Hill et al. | |
| 11,604,149 B2* | 3/2023 | Feler | G01N 21/9501 |
| 2006/0197951 A1 | 9/2006 | Frommer et al. | |
| 2011/0292365 A1 | 12/2011 | Cramer et al. | |
| 2018/0224753 A1 | 8/2018 | Mathijssen et al. | |
| 2021/0333218 A1 | 10/2021 | Feler | |
| 2022/0057192 A1 | 2/2022 | Bhattacharyya et al. | |

OTHER PUBLICATIONS

Korean Intellectual Property Office, International Search Report and Written Opinion for International Application No. PCT/US2023/017502, dated Jul. 25, 2023, 10 pages.

* cited by examiner

*Primary Examiner* — Hung V Nguyen
(74) *Attorney, Agent, or Firm* — Suiter Swantz pc llo

(57) ABSTRACT

An optical metrology system may include an overlay metrology tool for characterizing an overlay target on a sample, where the overlay target includes first-direction periodic features in a first set of layers of the sample, and second-direction periodic features in a second set of layers of the sample. The overlay metrology tool may simultaneously illuminate the overlay target with first illumination beams and second illumination beams and may further generate images of the overlay target based on diffraction of the first illumination beams and the second illumination beams by the overlay target, where diffraction orders of the first illumination beams contribute to resolved image formation of only the first-direction periodic features, and where diffraction orders of the second illumination beams contribute to resolved image formation of only the second-direction periodic features. The system may further generate overlay measurements along the first and second measurement directions based on the images.

31 Claims, 16 Drawing Sheets

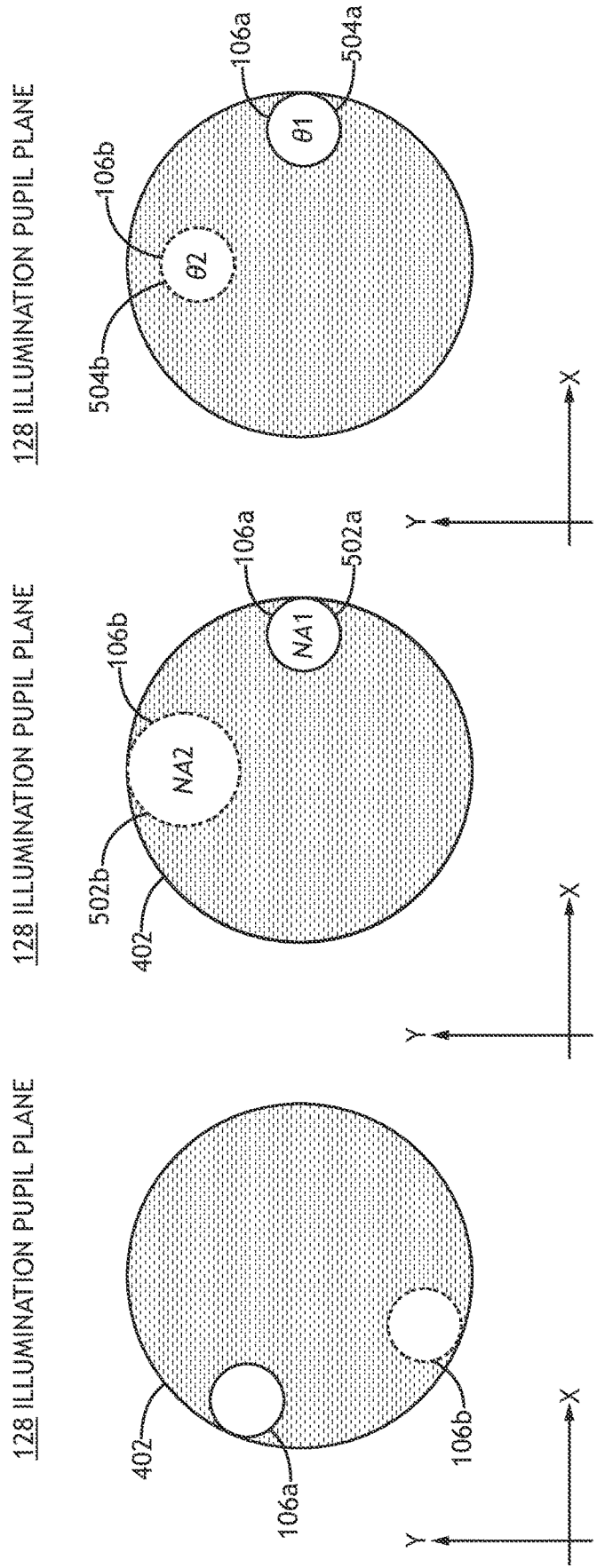

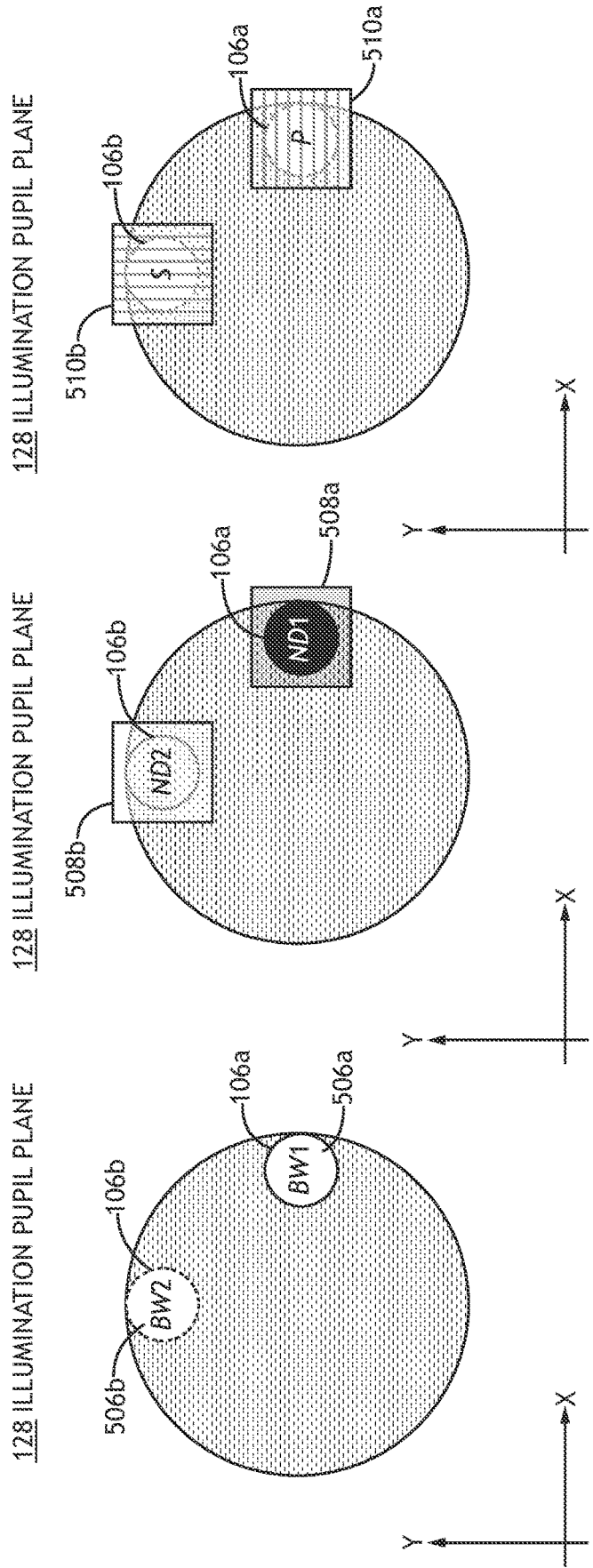

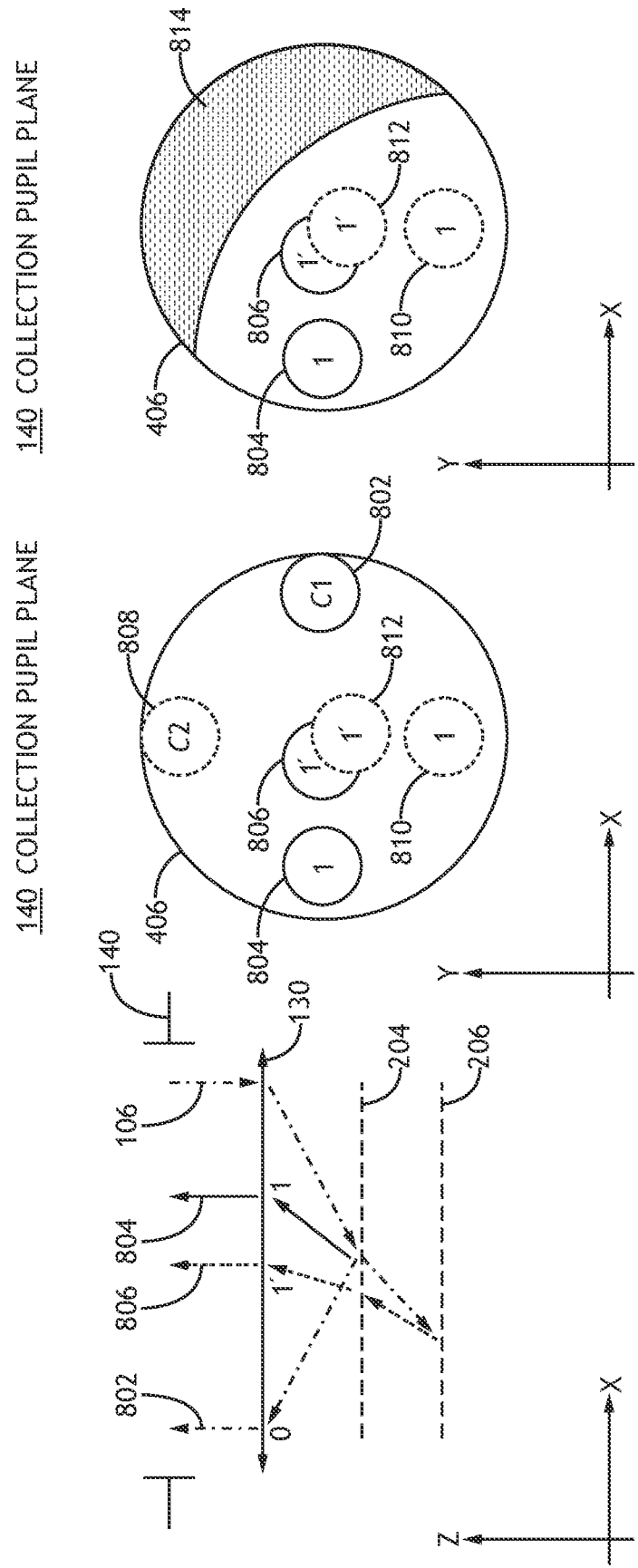

1000

1002 — ILLUMINATING AN OVERLAY TARGET ON A SAMPLE WITH ONE OR MORE FIRST ILLUMINATION BEAMS AND ONE OR MORE SECOND ILLUMINATION BEAMS, WHERE THE OVERLAY TARGET INCLUDES FIRST-DIRECTION PERIODIC FEATURES DISTRIBUTED ALONG A FIRST MEASUREMENT DIRECTION AND SECOND-DIRECTION PERIODIC FEATURES DISTRIBUTED ALONG A SECOND MEASUREMENT DIRECTION

1004 — GENERATING IMAGES OF THE OVERLAY TARGET ON ONE OR MORE DETECTORS BASED ON DIFFRACTION OF THE FIRST ILLUMINATION BEAMS AND THE SECOND ILLUMINATION BEAMS BY THE OVERLAY TARGET, WHERE DIFFRACTION ORDERS OF THE FIRST ILLUMINATION BEAMS CONTRIBUTE TO RESOLVED IMAGE FORMATION OF ONLY THE FIRST-DIRECTION PERIODIC ELEMENTS, AND WHERE DIFFRACTION ORDERS OF THE SECOND ILLUMINATION BEAMS CONTRIBUTE TO RESOLVED IMAGE FORMATION OF ONLY THE SECOND-DIRECTION PERIODIC ELEMENTS

1006 — GENERATING A SECOND OVERLAY MEASUREMENT ALONG THE SECOND MEASUREMENT DIRECTION BASED ON THE IMAGES

1008 — GENERATING A SECOND OVERLAY MEASUREMENT ALONG THE SECOND MEASUREMENT DIRECTION BASED ON THE IMAGES

MULTI-DIRECTIONAL OVERLAY METROLOGY USING MULTIPLE ILLUMINATION PARAMETERS AND ISOLATED IMAGING

TECHNICAL FIELD

The present disclosure relates generally to imaging overlay metrology and, more particularly, to simultaneous isolated imaging overlay metrology measurements along multiple directions.

BACKGROUND

Image-based overlay metrology typically generate overlay measurements by imaging multiple features on a sample fabricated using different lithographic exposures and determining relative positions of the imaged features. In this way, an overlay measurement may provide an indication of registration errors between the lithographic exposures. However, demands for the fabrication of smaller feature sizes result in tighter overlay tolerances. There is therefore a need to develop systems and methods providing overlay metrology with high accuracy and throughput.

SUMMARY

An optical metrology system is disclosed in accordance with one or more illustrative embodiments of the present disclosure. In one illustrative embodiment, the system includes an overlay metrology tool to implement a metrology recipe for characterizing an overlay target on a sample. In accordance with one or more illustrative embodiments of the present disclosure, the overlay target includes first-direction periodic features distributed along a first measurement direction and second-direction periodic features in a second set of layers of the sample. In another illustrative embodiment, the overlay metrology tool includes illumination optics to illuminate the overlay target with one or more first illumination beams and one or more second illumination beams, where at least one of the first illumination beams and at least one of the second illumination beams are incident on the overlay target simultaneously. In another illustrative embodiment, the overlay metrology tool further includes collection optics configurable to generate images of the overlay target on one or more detectors based on diffraction of the first illumination beams and the second illumination beams by the overlay target. In another illustrative embodiment, diffraction orders of the first illumination beams contribute to resolved image formation of only the first-direction periodic features and diffraction orders of the second illumination beams contribute to resolved image formation of only the second-direction periodic features. In another illustrative embodiment, the system further includes a controller to generate first and second overlay measurements along the first and second measurement directions based on the images.

An optical metrology system is disclosed in accordance with one or more illustrative embodiments of the present disclosure. In one illustrative embodiment, the system includes illumination optics to illuminate an overlay target on a sample with first illumination beams and second illumination beams when implementing a metrology recipe, where at least one of the first illumination beams and at least one of the second illumination beams are incident on the overlay target simultaneously. In another illustrative embodiment, the overlay target in accordance with the metrology recipe, includes first-direction periodic features distributed along a first measurement direction and second-direction periodic features distributed along a second measurement direction different than the first measurement direction. In another illustrative embodiment, the system further includes collection optics to generate images of the overlay target on one or more detectors based on diffraction of the first illumination beams and the second illumination beams by the overlay target. In another illustrative embodiment, diffraction orders of the first illumination beams contribute to resolved image formation of only the first-direction periodic features and diffraction orders of the second illumination beams contribute to resolved image formation of only the second-direction periodic features. In another illustrative embodiment, the system further includes a controller to generate first and second overlay measurements along the first and second measurement directions based on the images.

An optical metrology method is disclosed in accordance with one or more illustrative embodiments of the present disclosure. In one illustrative embodiment, the method includes illuminating an overlay target on a sample with first illumination beams and second illumination beams, where at least one of the first illumination beams and at least one of the second illumination beams are incident on the overlay target simultaneously. In another illustrative embodiment, the overlay target includes first-direction periodic features distributed along a first measurement direction and second-direction periodic features distributed along a second measurement direction different than the first measurement direction. In another illustrative embodiment, the method includes generating images of the overlay target on one or more detectors based on diffraction of the first illumination beams and the second illumination beams by the overlay target. In another illustrative embodiment, diffraction orders of the first illumination beams contribute to resolved image formation of only the first-direction periodic features and diffraction orders of the second illumination beams contribute to resolved image formation of only the second-direction periodic features. In another illustrative embodiment, the method includes generating a first overlay measurement along the first measurement direction based on the one or more images. In another illustrative embodiment, the method includes generating a second overlay measurement along the second measurement direction based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 5A is a conceptual view of an illumination pupil plane illustrating direction-dependent illumination beams with a rotated configuration, in accordance with one or more embodiments of the present disclosure.

FIG. 5B is a conceptual view of an illumination pupil plane illustrating direction-dependent illumination beams differentiated based on NA, in accordance with one or more embodiments of the present disclosure.

FIG. 5C is a conceptual view of an illumination pupil plane illustrating direction-dependent illumination beams differentiated based on obliquity, in accordance with one or more embodiments of the present disclosure.

FIG. 5D is a conceptual view of an illumination pupil plane illustrating direction-dependent illumination beams differentiated based on spectral properties, in accordance with one or more embodiments of the present disclosure.

FIG. 5E is a conceptual view of an illumination pupil plane illustrating direction-dependent illumination beams differentiated based on intensity, in accordance with one or more embodiments of the present disclosure.

FIG. 5F is a conceptual view of an illumination pupil plane illustrating direction-dependent illumination beams differentiated based on polarization, in accordance with one or more embodiments of the present disclosure.

FIG. 8A is a conceptual diagram of the generation of various diffraction lobes, in accordance with one or more embodiments of the present disclosure.

FIG. 8B is a conceptual view of a collection pupil plane illustrating direction-isolated imaging in an optical Moiré mode based on the diffraction lobes illustrated in FIG. 8A, in accordance with one or more embodiments of the present disclosure.

FIG. 8C is a conceptual view of a collection pupil plane of FIG. 8B including a blocker in the collection pupil plane to selectively block 0-order diffraction lobes, in accordance with one or more embodiments of the present disclosure.

FIG. 10 is a flow diagram illustrating steps performed in a method for direction-isolated imaging, in accordance with one or more embodiments of the present disclosure.

DETAILED DESCRIPTION

Figure 1A:
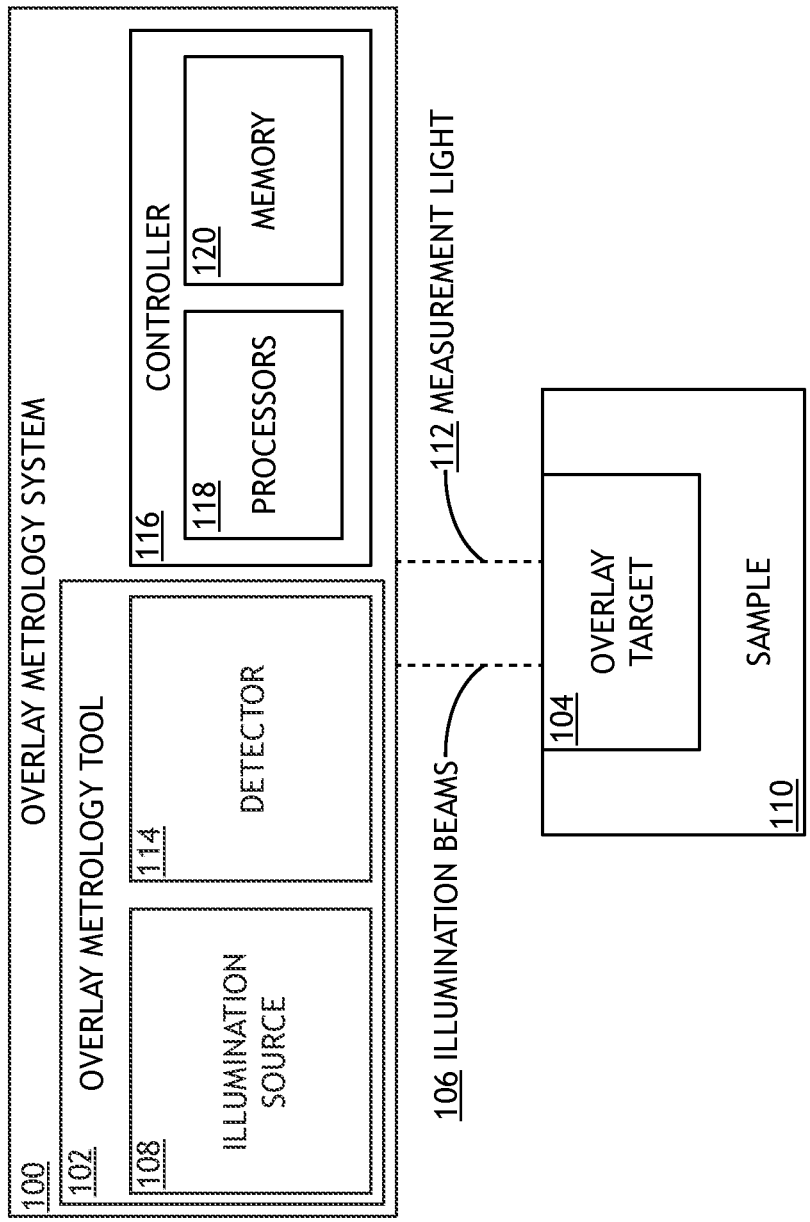
FIG. 1A is a conceptual view illustrating an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to system and methods for image-based overlay metrology providing direction-isolated imaging of sample features along different directions using simultaneous illumination with illumination beams having different illumination conditions. For example, an image (or a portion thereof) of sample features along a first direction (e.g., a first measurement direction) may be formed from illumination associated with a first illumination condition and an image (or a portion thereof) of sample features along a second direction (e.g., a second measurement direction) may be formed from illumination associated with a second illumination condition. For the purposes of the present disclosure, an illumination condition may include a set of parameters of an illumination beam used to generate an image including, but not limited to, numerical aperture (NA), beam shape, beam obliquity, azimuth angle of incidence, altitude angle of incidence, wavelength, spectral bandwidth, polarization, or intensity.

In some embodiments, overlay metrology is performed by illuminating an overlay target having at least two sets of periodic target features arranged to facilitate an overlay measurement along at least two different (e.g., orthogonal) measurement directions. For example, a set of periodic target features may include a periodic distribution of features along a particular measurement direction. As a non-limiting illustration, such a periodic distribution of features may include a diffraction grating (e.g., a grating structure) characterized by a grating pitch along a grating direction. In this way, an overlay target designed for overlay measurement along two different directions may include one set of periodic features with a first grating direction and a second set of periodic features with a second grating direction.

It is contemplated herein that various image quality metrics associated with an image of periodic target features may be impacted by the number and arrangement of diffraction orders from the periodic target features used to generate an image. Further, the impact of the particular number and arrangement of diffraction orders used to generate an image may be more significant for challenging applications such as, but not limited to, imaging of sample features at or near an optical resolution of an imaging system. As an illustration including a dark-field imaging technique, 0-order diffraction (e.g., specular reflection) may introduce a DC bias that may decrease image contrast. As another illustration particularly relevant to overlay metrology, diffraction from features that are not the object of a particular measurement may similarly decrease the contrast of an image and/or introduce other artifacts that may impact the sensitivity of a resulting measurement. For example, diffraction from a Y-direction grating may negatively impact an image of an X-direction grating (e.g., may decrease the contrast) and thus an overlay measurement based on the image.

Embodiments of the present disclosure are directed to systems and methods for providing illumination-isolated imaging of features with different grating directions. In this way, the image quality (e.g., contrast, or any other suitable image quality metric) may be improved relative to traditional techniques. In some embodiments, an overlay metrology system simultaneously illuminates an overlay target with multiple illumination beams having different direction-dependent illumination conditions, where the overlay target includes features with different (e.g., orthogonal) grating directions. In this way, each illumination beam may be diffracted along each of the grating directions. However, in embodiments of the present disclosure, an overlay metrology tool is configured (e.g., with a metrology recipe) such that diffracted lobes from any particular illumination beam only form an image of periodic features along one particular direction. In this configuration, diffraction of the particular illumination beam along other directions is insufficient to form a resolved image of the periodic structures.

It is recognized herein that formation of an image of a periodic structure requires at least two diffraction lobes to be collected and passed to a detector in order to contribute to image formation. For the purposes of the present disclosure, direction-isolated imaging refers to configurations in which, for any particular illumination beam, there is only one direction for which two or more diffraction lobes contribute to image formation. For other directions, at most one diffraction lobe is collected and passed to the detector. Under these conditions, periodic features along the other directions will be unresolved. In some embodiments, no diffraction orders associated with other directions are collected to avoid or mitigate any residual impacts of these other diffraction orders (e.g., DC bias associated with 0-order reflected light along other directions) that might negatively impact image quality. In some embodiments, a single diffraction order along other directions is allowed to pass to the detector and contribute to image formation (e.g., 0-order reflected light). In such cases, the residual impact of the single diffraction lobe may be within the tolerances of a particular application.

For example, an overlay target including orthogonal grating features (e.g., X-direction gratings and Y-direction gratings) may be simultaneously illuminated by a first illumination beam with a first set of illumination conditions and a second illumination beam with a second set of illumination conditions. However, only diffraction of the first illumination beam by the X-direction grating contributes to the formation of portions of the image including the X-direction gratings. Similarly, only diffraction of the second illumination beam by the Y-direction gratings contributes to the formation of portions of the image including Y-direction gratings. As a result, although the X and Y direction gratings are imaged simultaneously, the respective images (or portions thereof) are formed based on different illumination conditions provided by the first and second illumination beams.

Referring now to FIGS. 1A-10, systems and methods for optically-isolated imaging with direction-dependent illumination conditions is described in greater detail, in accordance with one or more embodiments of the present disclosure.

FIG. 1A is a conceptual view illustrating an overlay metrology system 100, in accordance with one or more embodiments of the present disclosure.

In some embodiments, the overlay metrology system 100 includes an overlay metrology tool 102 configurable according to a metrology recipe (e.g., an overlay recipe) to generate an overlay measurement associated with an overlay target 104 having a design based on the metrology recipe. For example, the overlay metrology tool 102 may direct two or more illumination beams 106 (e.g., direction-dependent illumination beams 106 with different illumination conditions) from at least one illumination source 108 to an overlay target 104 on sample 110, collect light or other radiation emanating from the overlay target 104 in response to the illumination beams 106 (referred to herein as measurement light 112), and generate detection signals from at least one detector 114 based on the measurement light 112.

The overlay metrology tool 102 may include any type of tool known in the art suitable for generating overlay signals suitable for determining overlay associated with overlay targets on a sample 110. In some embodiments, the overlay metrology tool 102 is an imaging metrology tool that generates overlay measurements based on one or more images of an overlay target 104. The overlay metrology tool 102 may generate images using any imaging technique or combination of imaging techniques known in the art including, but not limited to, bright-field or dark-field imaging techniques. Further, as disclosed herein, the overlay metrology tool 102 may be configured (e.g., based on a metrology recipe) to provide direction-dependent illumination conditions to provide optically-isolated imaging of features oriented along different directions.

Some embodiments of the present disclosure are directed to providing recipes for configuring the overlay metrology tool 102 to facilitate an overlay measurement based on selected diffraction orders. A metrology recipe may include a set of parameters for controlling various aspects of an overlay measurement such as, but not limited to, the illumination of a sample, the collection of light from the sample, or the position of the sample during a measurement. In this way, the overlay metrology tool 102 may be configured to provide a selected type of measurement for a selected overlay target design. For example, a metrology recipe may include parameters of the illumination beam 106 such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the overlay target 104 to be used for a measurement and associated filtered intensities at those angles), collection field stop settings to select portions of the overlay target 104 of interest, polarization of collected light, wavelength filters, or parameters for controlling one or more detectors. By way of another example, a metrology recipe may include various parameters associated with a design of the overlay target 104 such as, but not limited to, positions and orientations of sample features (e.g., pitches of grating features along particular directions). By way of a further example, a metrology recipe may include various parameters associated with the position of the sample 110 during a measurement such as, but not limited to, a sample height, a sample orientation, whether a sample is static during a measurement, or whether a sample is in motion during a measurement (along with associated parameters describing the speed, scan pattern, or the like).

In this way, the overlay metrology tool 102 may be configurable according to a metrology recipe to provide a selected distribution of light in a collection pupil when analyzing a particular overlay target 104 with a known design. This distribution of light in the collection pupil may then be further modified by various optics as desired to produce a desired overlay measurement.

In some embodiments, the overlay metrology system 100 further includes a controller 116 with one or more processors 118 configured to execute program instructions maintained on memory 120 (e.g., a memory medium). The controller 116 may be communicatively coupled with any of the components of the overlay metrology system 100 such as, but not limited to the detector 114. In this way, the controller 116 may generate overlay measurements based on the detection signals in accordance with the metrology recipe.

The one or more processors 118 of a controller 116 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 118 may include any device configured to execute algorithms and/or instructions (e.g., program instructions stored in memory). In one embodiment, the one or more processors 118 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure.

Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 116 or, alternatively, multiple controllers. Additionally, the controller 116 may include one or more controllers housed in a common housing or within multiple housings. In this way, any controller or combination of controllers may be separately packaged as a module suitable for integration into the overlay metrology system 100.

The memory 120 may include any storage medium known in the art suitable for storing program instructions executable by the associated one or more processors 118. For example, the memory 120 may include a non-transitory memory medium. By way of another example, the memory 120 may include, but is not limited to, a read-only memory (ROM), a random-access memory (RAM), a magnetic or optical memory device (e.g., disk), a magnetic tape, a solid-state drive and the like. It is further noted that memory 120 may be housed in a common controller housing with the one or more processors 118. In one embodiment, the memory 120 may be located remotely with respect to the physical location of the one or more processors 118 and controller 116. For instance, the one or more processors 118 of controller 116 may access a remote memory (e.g., server), accessible through a network (e.g., internet, intranet and the like).

Figure 2A:
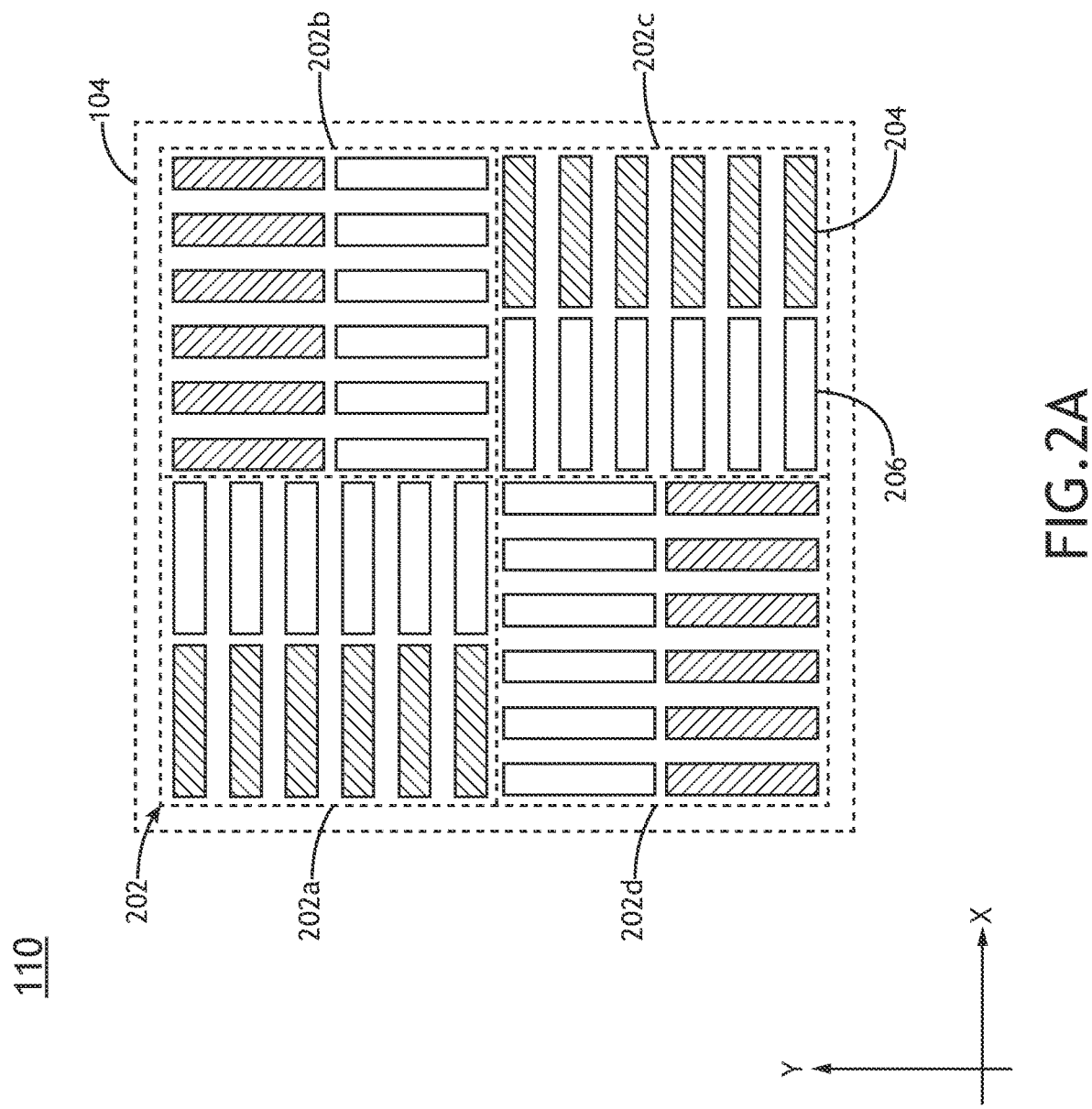
FIG. 2A is a top view of an overlay target with non-overlapping features, in accordance with one or more embodiments of the present disclosure.
Figure 2B:
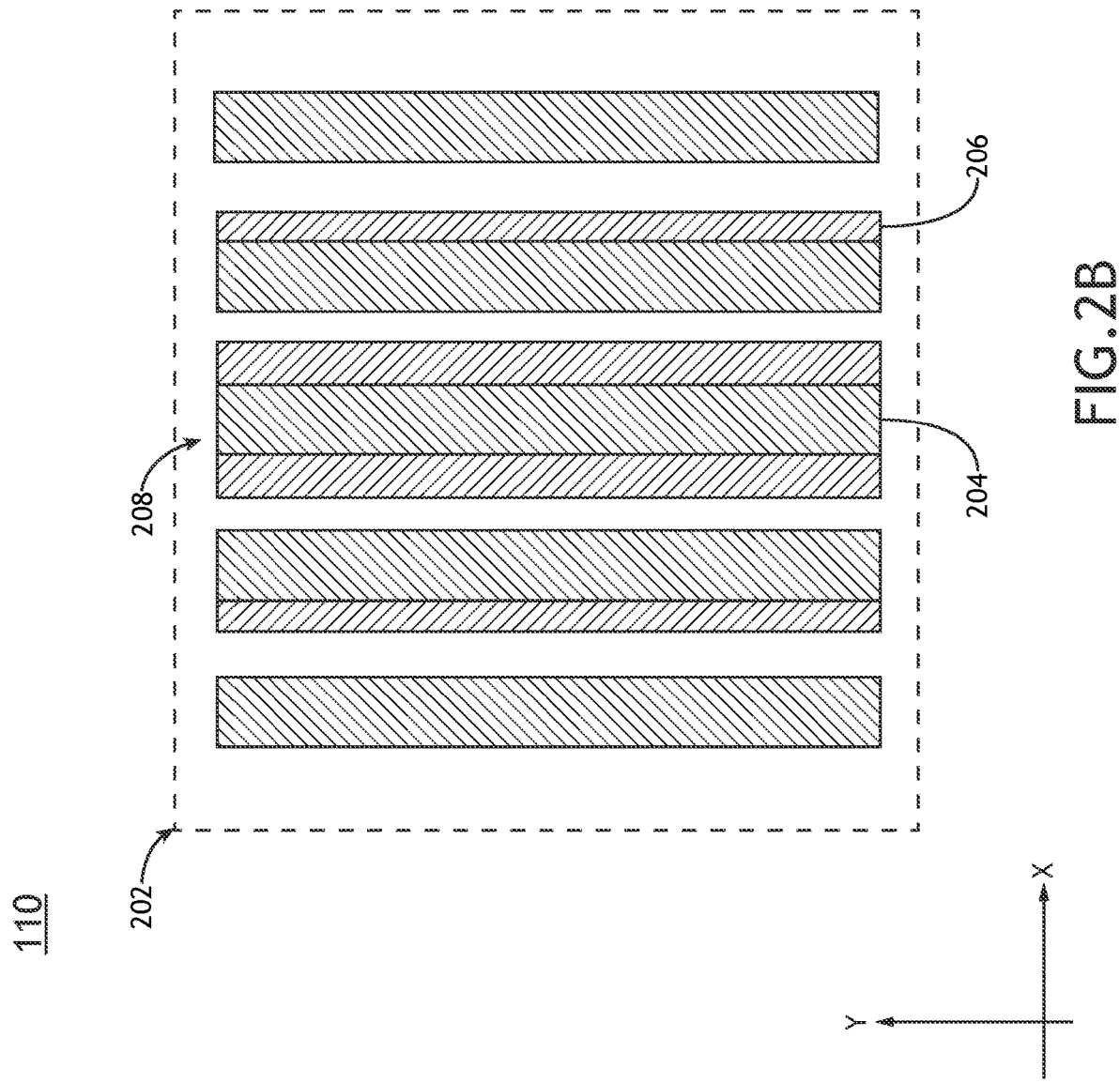
FIG. 2B is a top view of a cell of an overlay target with a Moiré structure, in accordance with one or more embodiments of the present disclosure.
Figure 2C:
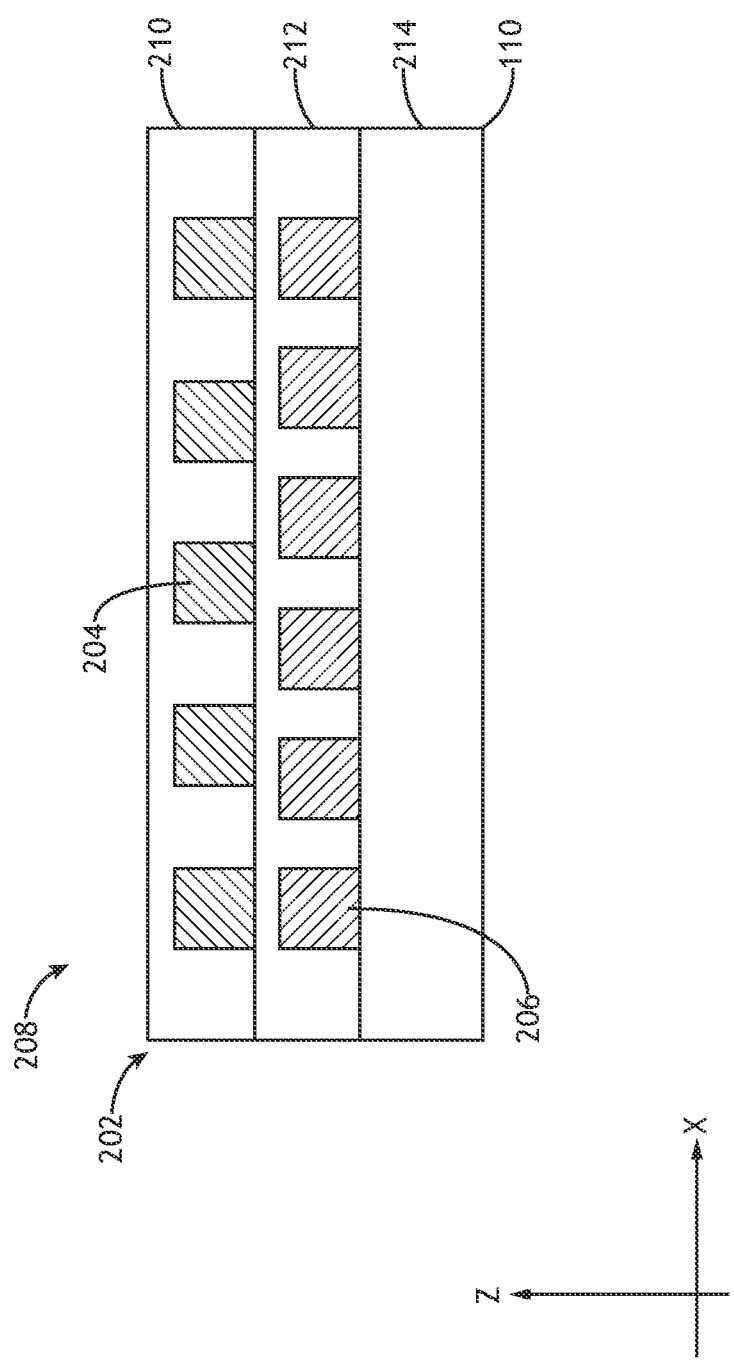
FIG. 2C is a side view of the cell in FIG. 2B on a substrate, in accordance with one or more embodiments of the present disclosure.

Referring now to FIGS. 2A-2C, various non-limiting examples of an overlay target 104 are described in greater detail, in accordance with one or more embodiments of the present disclosure.

For the purposes of the present disclosure, the term overlay is generally used to describe relative positions of features on a sample 110 fabricated by two or more lithographic patterning steps, where the term overlay error describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Further, the term overlay target 104 is used herein broadly to refer to any set of features on a sample having a known periodicity (e.g., corresponding to grating features) suitable for overlay measurements. In some embodiments, an overlay target 104 includes a dedicated target with features on one or more sample layers that are fabricated for the purpose of providing an overlay measurement that is typically representative of overlay of device features on the same layers. For example, a dedicated overlay target may include one or more cells having grating features with characteristics (e.g., grating pitch, feature size, grating orientation, or the like) designed to provide an overlay measurement according to a particular overlay technique. Such dedicated overlay targets may be printed at various locations on a sample including, but not limited to, within scribe lines or within dies. In some embodiments, an overlay target includes device features having known periodicities that are suitable for direct overlay measurements.

FIG. 2A is a top view of an overlay target 104 with non-overlapping features, in accordance with one or more embodiments of the present disclosure. In particular, FIG. 2A illustrates a non-limiting configuration of the overlay target 104 including four cells 202*a-d*, represented here as quadrants of the overlay target 104. In this configuration, each cell 202*a-d* may include a first set of periodic features 204 associated with a first lithographic exposure and a second set of periodic features 206 associated with a second lithographic exposure. Further, cell 202b and cell 202d may be configured to provide overlay measurements along the X direction as illustrated in FIG. 2A. For instance, an overlay measurement along the X direction may be made by directly comparing relative positions of the first set of periodic features 204 and the second set of periodic features 206 within each cell or between cell 202b and cell 202d. In another instance, an overlay measurement along the X direction may be made by comparing a point of rotational symmetry (e.g., rotational symmetry, reflection symmetry, mirror symmetry, or the like) between first set of periodic features 204 distributed across cell 202b and cell 202d with a point of symmetry between second set of periodic features 206 distributed across cell 202b and cell 202d. Similarly, cell 202a and cell 202c may be configured to provide overlay measurements along the Y direction as illustrated in FIG. 2A. In this way, the first set of periodic features 204 and the second set of periodic features 206 in cell 202b and cell 202d having periodicities along a first measurement direction (e.g., the X direction) may be referred to as first-direction periodic features, while the first set of periodic features 204 and the second set of periodic features 206 in cell 202a and cell 202c having periodicities along a second measurement direction (e.g., the Y direction) may be referred to as second-direction periodic features.

The first set of periodic features 204 and the second set of periodic features 206 in any particular cell 202 may be located on any layers of the sample 110. For example, the first set of periodic features 204 and the second set of periodic features 206 may be located on a common layer of the sample 110 to facilitate an overlay measurement between the first and second lithographic exposures in a multi-exposure processing flow. By way of another example, the first set of periodic features 204 may be located in a first layer of the sample 110 and the second set of periodic features 206 may be located on a second layer of the sample 110 to facilitate an overlay measurement between the first and second layers. Further, the first set of periodic features 204 and the second set of periodic features 206 associated with a first measurement direction (e.g., first-direction periodic features) may be located in a first set of layers of the sample 110, while the first set of periodic features 204 and the second set of periodic features 206 associated with a second measurement direction (e.g., second-direction periodic features) may be located in a second set of layers of the sample 110 that may be the same or different than for the first-direction periodic features. As an illustration, cell 202b and cell 202d may include a first set of periodic features 204 in a first layer 210 of the sample 110 and a second set of periodic features 206 in a second layer 212 of the sample 110 as described above, while cell 202a and cell 202c may include a first set of periodic features 204 in the first layer 210 of the sample 110 and a second set of periodic features 206 in a third layer of the sample 110 (not explicitly illustrated).

In some embodiments, the overlay target 104 includes different configurations of printed elements oriented along different directions. For example, the cell 202b and cell 202d may include a first set of periodic features 204 in a first layer 210 and a second set of periodic features 206 in a second layer 212, while the cell 202a and cell 202c may include a first set of periodic features 204 in a first layer 210 and a second set of periodic features 206 in a third layer of the sample 110. In this way, the overlay target 104 may facilitate simultaneous overlay measurements between multiple different layer pairs.

Additionally, the first set of periodic features 204 and the second set of periodic features 206 in any particular cell 202 may have the same or different pitches. For example, FIG. 2A illustrates a configuration of the overlay target 104 in which the first set of periodic features 204 and the second set of periodic features 206 in each of the cells 202a-d have a common pitch. However, the first set of periodic features 204 and the second set of periodic features 206 may have different pitches.

In some embodiments, the first set of periodic features 204 and the second set of periodic features 206 within any particular cell 202 are formed in different layers of the sample 110. For example, the first set of periodic features 204 and the second set of periodic features 206 within any particular cell 202 may be formed in an at least partially overlapping regions of the sample to generate a grating-over-grating structure or in non-overlapping regions. In this configuration, the first set of periodic features 204 and the second set of periodic features 206 may have the same or different pitches. As an illustration, a configuration in which the first set of periodic features 204 and the second set of periodic features 206 have different pitches may form a Moiré structure. Such a Moiré structure may generate Moiré diffraction (e.g., double diffraction, combined diffraction, or the like) associated with diffraction from both the first set of periodic features 204 and the second set of periodic features 206. It is contemplated herein that different overlay techniques (e.g., associated with different metrology recipes) may utilize any combination of diffraction lobes from the constituent features (e.g., the first set of periodic features 204 and the second set of periodic features 206) alone or in combination with a Moiré diffraction lobe. For instance, a first metrology recipe may utilize first-order diffraction lobes from each of the constituent features, while a second metrology recipe may utilize a Moiré diffraction lobe either alone or in combination with diffraction lobes from one or more of the constituent features.

FIG. 2B is a top view of a cell 202 of an overlay target 104 with a Moiré structure 208, in accordance with one or more embodiments of the present disclosure. FIG. 2C is a side view of the cell 202 in FIG. 2B, in accordance with one or more embodiments of the present disclosure. In particular, FIGS. 2B and 2C illustrate the pitches of the first set of periodic features 204 in a first layer 210 of the sample 110 (e.g., a first-layer grating) and the second set of periodic features 206 on a second layer 212 of the sample 110 (e.g., a second-layer grating) as P and Q, respectively. FIG. 2B further illustrates a substrate 214 on which various layers are deposited. In some embodiments, though not explicitly shown, the overlay target 104 includes two cells 202 per measurement direction providing an inverted Moiré structure pair. For example, a first cell 202 may include first set of periodic features 204 with pitch P and second set of periodic features 206 with pitch Q, while a second cell 202 may include first set of periodic features 204 with pitch Q and second set of periodic features 206 with pitch P.

Referring generally to FIGS. 2A-2C, the overlay target 104 may generally include any overlay target design known suitable for image-based diffraction. For example, the overlay target 104 may include, but is not limited to, an Advanced Imaging Metrology (AIM) target, a triple AIM target having features on three layers, a robust AIM (rAIM) target including one or more Moiré structures, or the like.

Figure 1B:
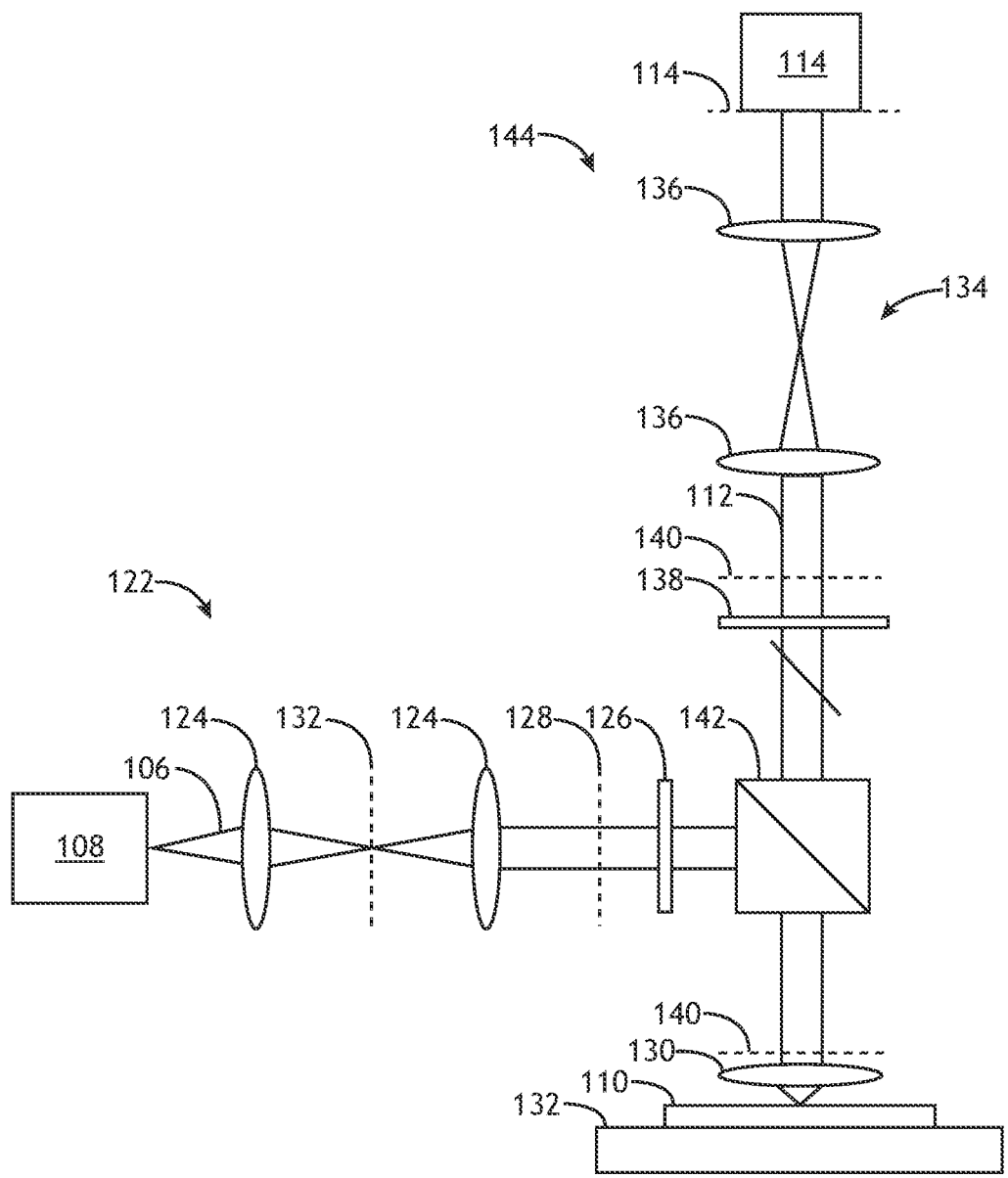
FIG. 1B is a conceptual view illustrating the overlay metrology tool, in accordance with one or more embodiments of the present disclosure.

Referring now to FIG. 1B, various aspects of the overlay metrology tool 102 are described, in accordance with one or more embodiments of the present disclosure.

FIG. 1B is a conceptual view illustrating the overlay metrology tool 102, in accordance with one or more embodiments of the present disclosure. In one embodiment, the overlay metrology tool 102 includes an illumination source 108 configured to generate at least one illumination beam 106. The illumination from the illumination source 108 may include one or more selected wavelengths of light including, but not limited to, ultraviolet (UV) radiation, visible radiation, or infrared (IR) radiation.

In another embodiment, the overlay metrology tool 102 directs the illumination from the illumination source 108 to an overlay target 104 via an illumination pathway 122. The illumination pathway 122 may include one or more optical components suitable for modifying and/or conditioning the illumination beam 106 as well as directing the illumination beam 106 to the sample 110. In one embodiment, the illumination pathway 122 includes one or more illumination-pathway lenses 124 (e.g., to collimate the illumination, to relay pupil and/or field planes, or the like). In another embodiment, the illumination pathway 122 includes one or more illumination-pathway optics 126 to shape or otherwise control the illumination. For example, the illumination-pathway optics 126 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). Further, the illumination-pathway optics 126 may be located in any suitable location including, but not limited to, an illumination pupil plane 128 or an illumination field plane.

In another embodiment, the overlay metrology tool 102 includes an objective lens 130 to focus the illumination onto the overlay target 104. In another embodiment, the sample 110 is disposed on a sample stage 132 suitable for securing the sample 110 and further configured to position an overlay target 104 with respect to the illumination beam 106.

In some embodiments, the overlay metrology tool 102 includes at least one detector 114 to capture light or other illumination emanating from the overlay target 104 (e.g., the measurement light 112) through a collection pathway 134. The collection pathway 134 may include one or more optical elements suitable for modifying and/or conditioning the measurement light 112 from the overlay target 104. In one embodiment, the collection pathway 134 includes one or more collection-pathway lenses 136 (e.g., to collimate the illumination beam 106, to relay pupil and/or field planes, or the like), which may include, but is not required to include, the objective lens 130. In another embodiment, the collection pathway 134 includes one or more collection-pathway optics 138 to shape or otherwise control the measurement light 112. For example, the collection-pathway optics 138 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). Further, the collection-pathway optics 138 may be located in any suitable location including, but not limited to, a collection pupil plane 140 or a collection field plane (not shown).

A detector 114 may be located at any selected location within the collection pathway 134. In some embodiments, the overlay metrology tool 102 includes a detector 114 at a field plane (e.g., a plane conjugate to the sample 110) to generate an image of the overlay target 104.

The illumination pathway 122 and the collection pathway 134 of the overlay metrology tool 102 may be oriented in a wide range of configurations suitable for illuminating the sample 110 with the illumination beam 106 and collecting light emanating from the sample 110 in response to the incident illumination beam 106. For example, as illustrated in FIG. 1B, the overlay metrology tool 102 may include a beamsplitter 142 oriented such that a common objective lens 130 may simultaneously direct the illumination beam 106 to the sample 110 and collect light from the sample 110. By way of another example, the illumination pathway 122 and the collection pathway 134 may contain non-overlapping optical paths.

Further, the illumination pathway 122 and/or the collection pathway 134 may include one or more channels. For example, the illumination pathway 122 may provide the two or more illumination beams 106 from a single illumination channel or through dedicated illumination channels. By way of another example, the collection pathway 134 may include a single detector 114 in a single collection channel or multiple detectors 114 distributed among multiple collection channels.

Figure 1C:
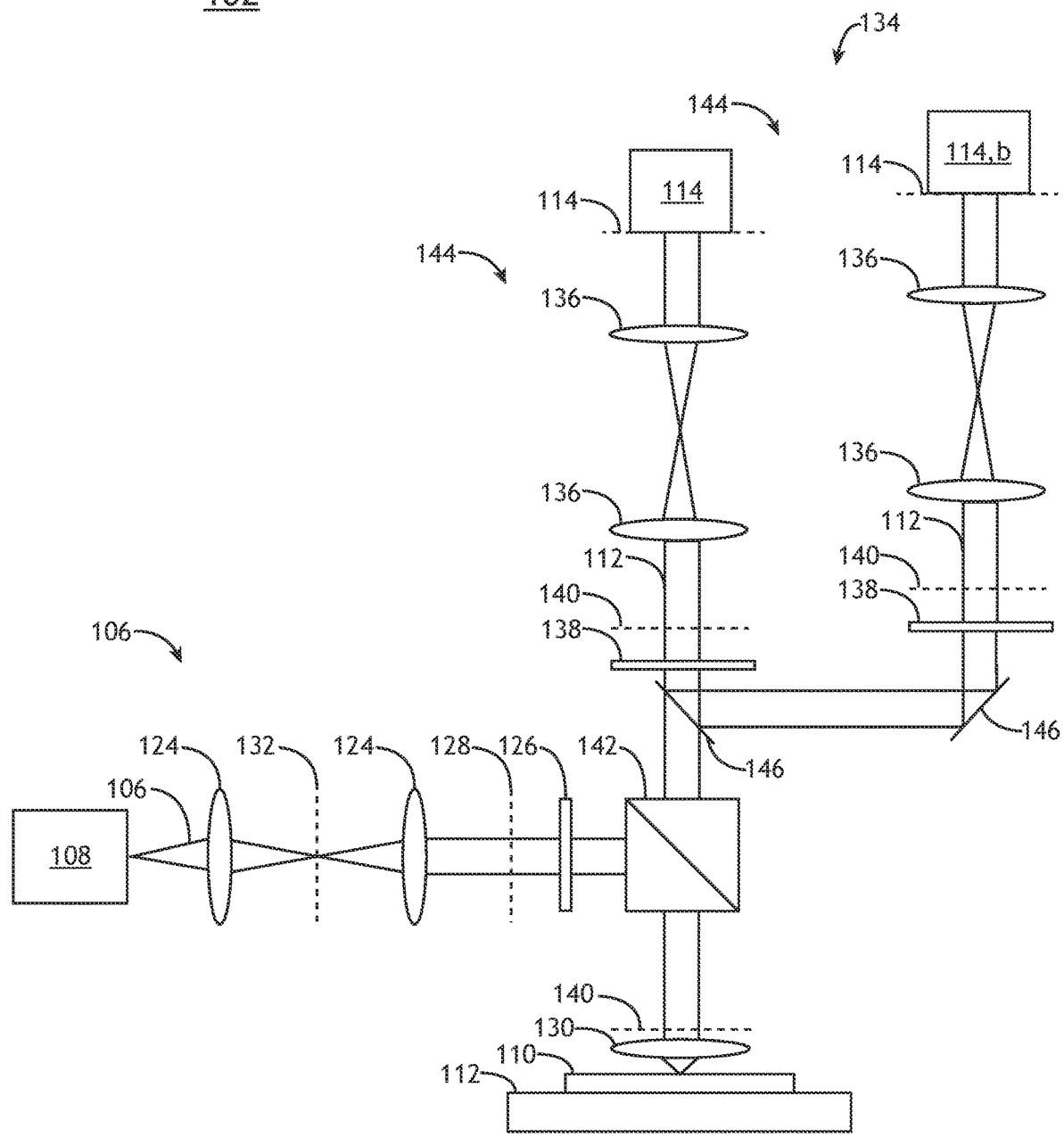
FIG. 1C is a conceptual view of an overlay metrology tool including two collection channels, in accordance with one or more embodiments of the present disclosure.

As an illustration, FIG. 1B illustrates an overlay metrology tool 102 with a single collection channel 144. FIG. 1C is a conceptual view of an overlay metrology tool 102 including two collection channels 144, in accordance with one or more embodiments of the present disclosure. For example, the overlay metrology tool 102 may include one or more beamsplitters 146 to split the measurement light 112 into at least two collection channels 144. Further, each collection channel 144 may include separate collection-pathway optics 138 (e.g., polarizers, spectral filters, neutral density filters, blockers, apertures, or the like) to separately modify the measurement light 112 within each collection channel 144 to provide direction-isolated imaging. It is contemplated herein that the use of multiple collection channels 144 may allow for greater flexibility for the generation of direction-isolated images than with a collection channel 144 but may add additional complexity. In this way, the particular implementation of the systems and methods disclosed herein may be selected or adapted for the tolerances of a particular application.

Referring now to FIGS. 3A-9, overlay measurements based on direction-isolated imaging of features oriented along different directions is described in greater detail, in accordance with one or more embodiments of the present disclosure.

It is contemplated herein that periodic structures on an overlay target 104 (e.g., the first set of periodic features 204 and the second set of periodic features 206 illustrated in FIGS. 2A-2C) may generate discrete diffraction orders when illuminated with an illumination beam 106 having a narrow spectral range and a limited angular extent. Further, the particular arrangement of diffraction orders of an illumination beam 106 in a collection pupil plane 140 may be influenced by various properties of the illumination beam 106 (e.g., spectrum, polarization, incidence angle in azimuth and/or altitude directions, numerical aperture (NA), or the like), the collection pathway 134 (e.g., the NA of the objective lens 130, or the like), or the overlay target 104 (e.g., pitches of printed features, orientations of the printed features relative to the incident illumination beam 106, or the like).

Figure 3A:
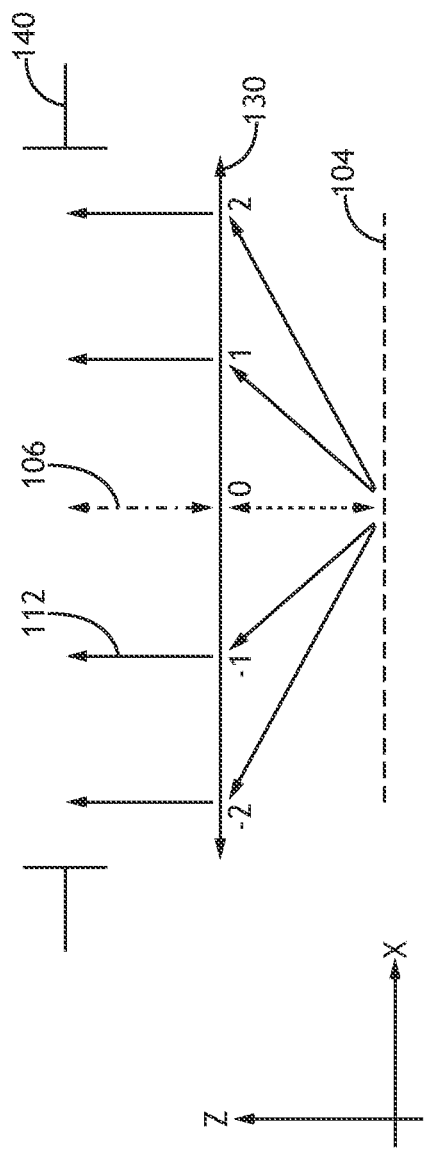
FIG. 3A is a conceptual diagram of the collection of diffraction orders from an illumination beam at normal incidence, in accordance with one or more embodiments of the present disclosure.
Figure 3B:
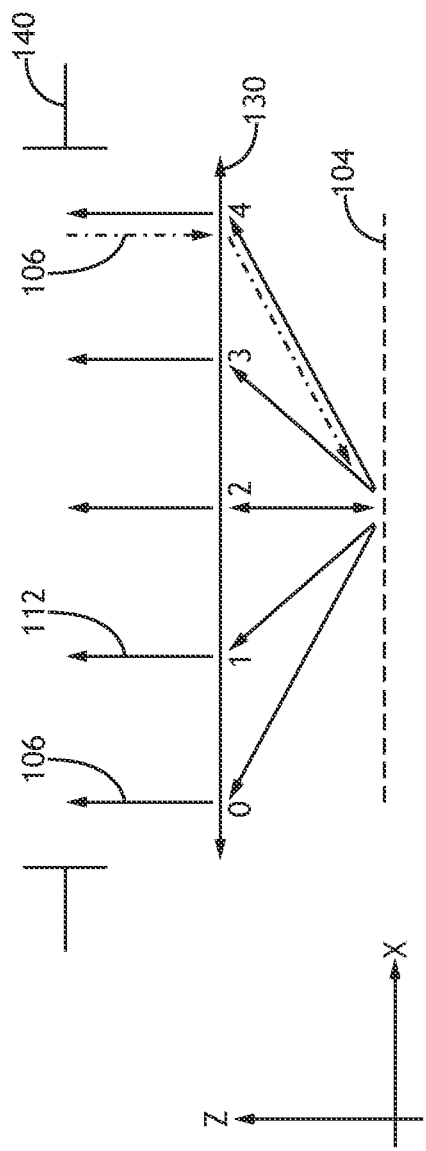
FIG. 3B is a conceptual diagram of the collection of diffraction orders from an illumination beam at oblique incidence, in accordance with one or more embodiments of the present disclosure.

As an illustration, FIGS. 3A and 3B depict the impact of altitude incidence angle on a distribution of diffraction orders from a grating (e.g., on an overlay target 104). FIG. 3A is a conceptual diagram of the collection of diffraction orders from an illumination beam 106 at normal incidence, in accordance with one or more embodiments of the present disclosure. FIG. 3B is a conceptual diagram of the collection of diffraction orders from an illumination beam 106 at oblique incidence, in accordance with one or more embodiments of the present disclosure. In particular, FIGS. 3A and 3B illustrate control of the particular diffraction orders that are collected by the objective lens 130 based on the incidence angle.

Accordingly, in some embodiments, the overlay metrology tool 102 and/or the sample are configured via a metrology recipe to provide for the collection of selected diffraction orders to facilitate direction-isolated imaging.

In some embodiments, the overlay metrology tool 102 simultaneously illuminates an overlay target 104 with two or more illumination beams 106, where various parameters of each illumination beam 106 are arranged to facilitate separation of diffraction orders of the illumination beams 106 along different directions (e.g., in a collection pupil plane 140). Various parameters of the objective lens 130 and/or the collection pathway 134 may then be configured to provide direction-isolated imaging on one or more detectors 114, where gratings with a particular grating direction are exclusively imaged with light from a particular illumination beam 106.

It is contemplated herein that direction-isolated imaging may be implemented using a variety of configurations of the overlay metrology tool 102.

In some embodiments, the overlay metrology tool 102 is configured such that the objective lens 130 only collects selected diffraction orders associated with each illumination beam 106 that provide direction-isolated imaging as disclosed herein. In such a configuration, the objective lens 130 may provide direction-isolated imaging using a single detector 114, where portions of a generated image associated with grating structures with different grating directions are imaged based on different illumination beams 106.

Figure 4B:
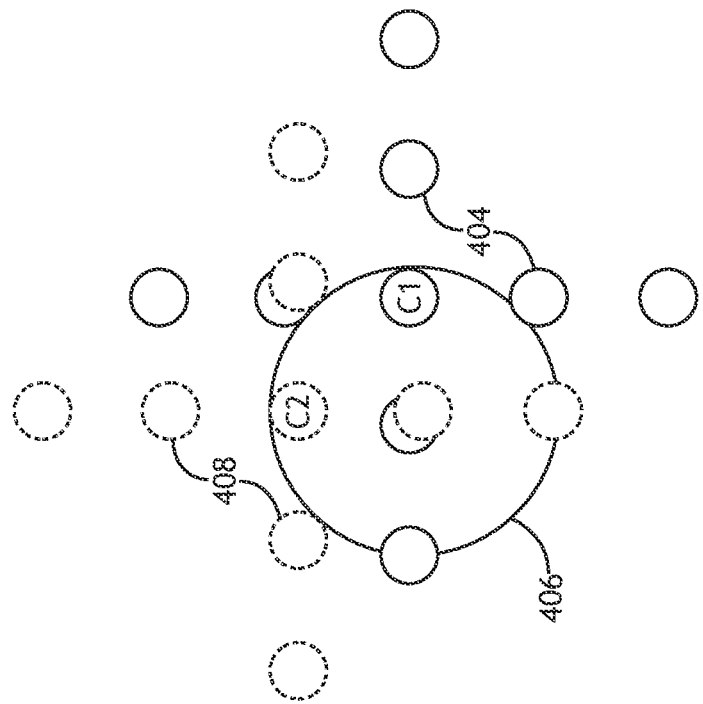
FIG. 4B is a conceptual view of a collection pupil plane illustrating direction-isolated imaging based on the illumination profile of FIG. 4A, in accordance with one or more embodiments of the present disclosure.
Figure 4A:
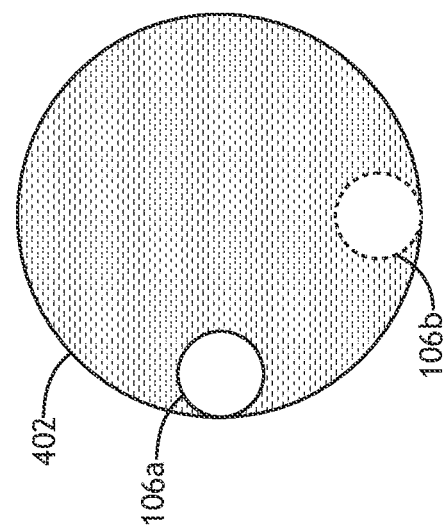
FIG. 4A is a conceptual view of an illumination pupil plane including two illumination beams within the illumination pupil boundary positioned to provide oblique illumination along orthogonal azimuth directions, in accordance with one or more embodiments of the present disclosure.

FIGS. 4A and 4B illustrate direction-isolated imaging of a Moiré structure (e.g., as illustrated in FIGS. 2B and 2C) based on illumination beams 106 with different azimuth incidence angles, in accordance with one or more embodiments of the present disclosure. In particular, FIG. 4A illustrates a configuration in which the objective lens 130 only collects selected diffraction orders associated with each illumination beam 106 that provide direction-isolated imaging.

FIG. 4A is a conceptual view of an illumination pupil plane 128 including two illumination beams 106*a,b* within the illumination pupil boundary 402 positioned to provide oblique illumination along orthogonal azimuth directions, in accordance with one or more embodiments of the present disclosure. FIG. 4B is a conceptual view of a collection pupil plane 140 illustrating direction-isolated imaging based on the illumination profile of FIG. 4A, in accordance with one or more embodiments of the present disclosure. For example, FIG. 4B illustrates diffraction lobes generated in response to illumination of an overlay target 104 illustrated in FIG. 2A.

As illustrated in FIG. 4B, illumination of the overlay target 104 with the illumination beam 106*a* results in diffraction lobes 404 distributed along both the X and Y directions. However, only selected diffraction orders along the X direction lie with the collection pupil boundary 406 and are thus available to contribute to the formation of an image of the corresponding structures. Similarly, illumination of the overlay target 104 with the illumination beam 106*b* results in diffraction lobes 408 distributed along both the X and Y directions, but only selected diffraction orders along the Y direction lie with the collection pupil boundary 406 and are thus available to contribute to the formation of an image of the corresponding structures.

In this way, portions of an image of features distributed along the X direction are optically isolated from portions of an image of features distributed along the Y direction. Put another way, grating information will be coded per illumination condition as provided by the selection of diffraction orders that contribute to image formation. As a result, various image quality metrics associated with features oriented along the X direction may depend entirely (or at least substantially) on the selected diffraction orders from the illumination beam 106*a* and image quality metrics associated with features oriented along the Y direction may depend entirely (or at least substantially) on the selected diffraction orders from the illumination beam 106*b*.

Referring generally to FIGS. 3A-4B, it is to be understood that FIGS. 3A-4B are provided solely for illustrative purposes and should not be interpreted as limiting. For example, in FIGS. 4A and 4B, the primary difference between the illumination conditions associated with the illumination beams 106*a,b* is the azimuth incidence angle. However, it is contemplated herein that direction-dependent illumination-isolated imaging may be achieved using multiple illumination beams 106 with illumination conditions that are differentiated based on any combination of parameters including, but not limited to, NA, beam shape, wavelength, spectral bandwidth, polarization, or intensity. Further, such differentiations of illumination conditions may be achieved using any technique known in the art including, but not limited to, illumination-pathway optics 126 or direct generation of illumination beams 106 with different illumination conditions.

Additionally, the overlay metrology tool 102 may include various configurations of the collection pathway 134 to further isolate selected diffraction lobes to provide direction-isolated imaging.

In some embodiments, the collection pathway 134 includes one or more collection-pathway optics 138 to filter or block selected diffraction lobes in the collection pupil plane 140 (e.g., that are collected by the objective lens 130) but are nonetheless not desirable for a particular imaging technique. For instance, as will be described in greater detail below, it may be desirable to block 0-order diffracted light (e.g., specular reflection) along one or more directions to ensure optical isolation and/or implement dark-field imaging.

In some embodiments (e.g., as illustrated in FIG. 1C), the overlay metrology tool 102 includes multiple collection channels 144. In this way, each collection channel 144 may include different collection-pathway optics 138 to filter or block various diffraction lobes. For example, each collection channel 144 may provide an image of gratings along a different selected direction based on diffracted light from different illumination beams 106.

Referring now to FIGS. 5A-5F, various techniques for providing direction-dependent illumination-isolated imaging are described in greater detail, in accordance with one or more embodiments of the present disclosure. It is noted that FIGS. 5A-5F depict differentiation of illumination conditions based on both azimuth incidence angle and additional properties, though it is to be understood that azimuth incidence angle differentiation is not required.

FIGS. 5A-5F illustrate various non-limiting techniques for differentiating illumination beams 106 based on the location, size, shape, or orientation of the illumination beams 106 in an illumination pupil plane 128.

FIG. 5A is a conceptual view of an illumination pupil plane 128 illustrating direction-dependent illumination beams 106 with a rotated configuration, in accordance with one or more embodiments of the present disclosure. In particular, FIG. 5A illustrates an illumination lobe distribution similar to that in FIG. 4A, but where the illumination beams 106a,b are rotated relative to the grating directions of the overlay target 104 (e.g., the X and Y directions illustrated in FIG. 2A). It is noted that although the illumination beams 106a,b are rotated relative to the grating directions of the overlay target 104, the associated diffraction lobes will still be distributed along the grating directions. However, the use of rotated lobes may allow for further separation of diffraction orders in the collection pupil plane 140 and may be suitable for some applications.

FIG. 5B is a conceptual view of an illumination pupil plane 128 illustrating direction-dependent illumination beams 106 differentiated based on NA, in accordance with one or more embodiments of the present disclosure. In particular, FIG. 5B illustrates apertures 502a,b with different sizes (labeled NA1,NA2) to provide illumination beams 106a,b. Further, the apertures 502a,b may be implemented as separate elements or by a spatially-selective element.

Additionally, though not shown, the illumination beams 106a,b may generally have any selected shape in the illumination pupil plane 128, which may correspond to the shape of the associated diffraction orders. For example, shapes of the illumination beams 106a,b in the illumination pupil plane 128 may include, but are not limited to, circles, ellipses, or cats-eyes (e.g., geometric lenses). Further, the illumination beams 106a,b may have the same shape or different shapes. In some embodiments, the shapes of the illumination beams 106a,b in the illumination pupil plane 128 are controlled by apertures 502a,b in the illumination pupil plane 128.

FIG. 5C is a conceptual view of an illumination pupil plane 128 illustrating direction-dependent illumination beams 106 differentiated based on obliquity, in accordance with one or more embodiments of the present disclosure. In particular, FIG. 5C illustrates apertures 504a,b at different radial positions (labeled θ1, θ2) in the illumination pupil plane 128 to provide illumination beams 106a,b with different altitude incidence angles. Further, the apertures 502a,b may be implemented as separate elements or by a spatially-selective element.

FIG. 5D is a conceptual view of an illumination pupil plane 128 illustrating direction-dependent illumination beams 106 differentiated based on spectral properties, in accordance with one or more embodiments of the present disclosure. In particular, FIG. 5D illustrates spectral filters 506a,b (labeled BW1,BW2) to impart different spectral properties on the illumination beams 106a,b. The spectral filters 506a,b may be any type of spectral filter including, but not limited to, high-pass filters, low-pass filters, band-pass filters, or band-reject filters. In this way, the spectral filters 506a,b may differentiate the illumination beams 106a,b based on spectral properties such as, but not limited to, central wavelength or bandwidth. Further, the spectral filters 506a,b may be implemented as separate elements or by a spatially-selective element.

FIG. 5E is a conceptual view of an illumination pupil plane 128 illustrating direction-dependent illumination beams 106 differentiated based on intensity, in accordance with one or more embodiments of the present disclosure. In particular, FIG. 5E illustrates neutral density filters 508a,b (labeled ND1,ND2) to impart different intensities on the illumination beams 106a,b. Further, the neutral density filters 508a,b may be implemented as separate elements or by a spatially-selective element.

FIG. 5F is a conceptual view of an illumination pupil plane 128 illustrating direction-dependent illumination beams 106 differentiated based on polarization, in accordance with one or more embodiments of the present disclosure. In particular, FIG. 5F illustrates polarizers 510a,b (labeled S,P) to impart different polarizations on the illumination beams 106a,b (e.g., orthogonal polarizations). Further, the polarizers 510a,b may be implemented as separate elements or by a spatially-selective element.

Referring generally to FIGS. 4A-5F, it is contemplated herein that an overlay metrology tool 102 may generally implement any combination of such techniques. For example, FIGS. 4A-5C may generally be suitable for, but not limited to, manipulating a distribution of diffraction lobes collected by the objective lens 130 and are thus available to contribute to imaging. However, as will be described in greater detail below, it may be desirable to provide additional filtering and/or blocking of collected diffraction lobes either to implement fully isolated per-direction imaging or to implement a particular imaging technique. FIGS. 5D-5F may generally be suitable for, but not limited to, manipulating additional properties of the illumination beams 106a,b such that additional elements in any collection channel 144 may isolate and/or filter associated diffraction lobes.

Figure 6:
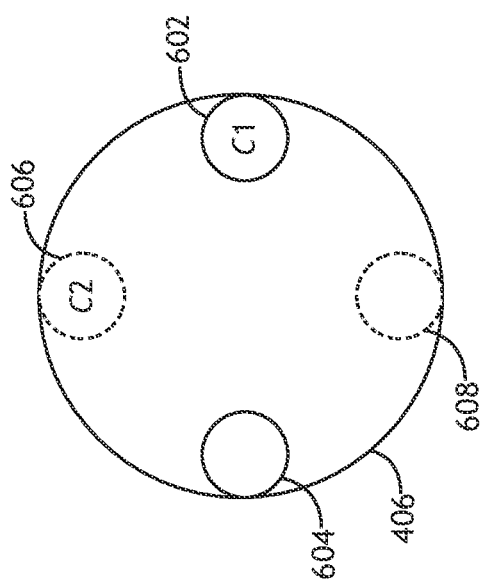
FIG. 6 is a conceptual view of a collection pupil plane illustrating direction-isolated imaging in an oblique bright-field imaging mode based on the illumination distribution shown in FIG. 4A, in accordance with one or more embodiments of the present disclosure.
Figure 7B:
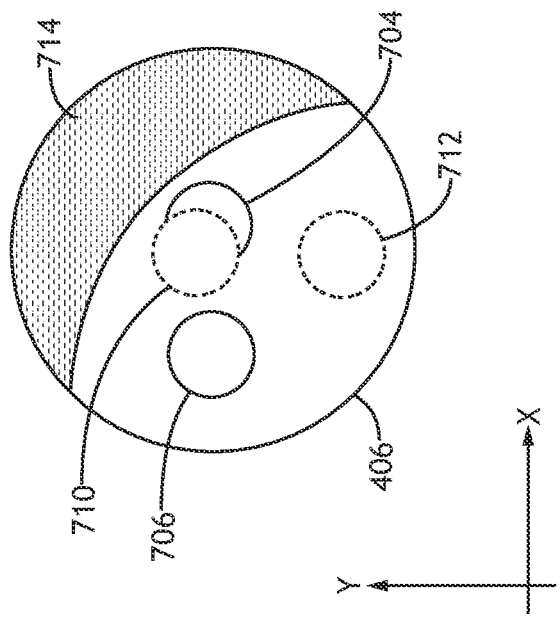
FIG. 7B is a conceptual view of the collection pupil plane of FIG. 7A in which 0-order diffraction lobes are blocked to provide dark-field imaging, in accordance with one or more embodiments of the present disclosure.

Referring now to FIGS. 6-8C, various non-limiting imaging modes based on direction-isolated imaging are described in greater detail, in accordance with one or more embodiments of the present disclosure. FIGS. 6-8C are based on illumination with the profile shown in FIG. 4A. Further, FIGS. 6-7B illustrate imaging of an overlay target 104 with common-pitch periodic features (e.g., as illustrated in FIG. 2A), whereas FIGS. 8A-8C illustrate imaging of an overlay target 104 with different-pitch periodic features (e.g., a Moiré structure as illustrated in FIGS. 2B-2C).

In FIGS. 6-8C, the overlay target 104 being imaged includes periodic structures oriented along orthogonal grating directions (e.g., X and Y directions as illustrated in FIGS. 2A-2C).

It is contemplated herein that the principles disclosed herein regarding direction-isolated imaging may generally be extended to a wide range of imaging techniques. It is therefore to be understood that FIGS. 6-8C are provided solely for illustrative purposes and should not be interpreted as limiting.

FIG. 6 is a conceptual view of a collection pupil plane 140 illustrating direction-isolated imaging in an oblique brightfield imaging mode based on the illumination distribution shown in FIG. 4A, in accordance with one or more embodiments of the present disclosure. In particular, FIG. 6 illustrates a configuration of the overlay metrology tool 102 (e.g., based on a metrology recipe) that exclusively provides a 0-order diffraction lobe 602 (e.g., specular reflection) and a first-order diffraction lobe 604 of the first illumination beam 106a by X-direction periodic structures (e.g., cells 202b,d in FIG. 2A), along with a 0-order diffraction lobe 606 and a first-order diffraction lobe 608 of the second illumination beam 106b by Y-direction periodic structures (e.g., cells 202a,c in FIG. 2A).

In this way, an image (or a portion thereof) of the X-direction periodic structures (e.g., cells 202*b,d* in FIG. 2A) is formed by the first illumination beam 106*a*, while an image (or a portion thereof) of the Y-direction periodic structures (e.g., cells 202*a,c* in FIG. 2A) is formed by the second illumination beam 106*b*.

However, it is noted that a single image based on the collection pupil plane 140 in FIG. 6 may exhibit residual DC bias originating from 0-order diffraction lobes 602,606 from the orthogonal directions. For example, the image of the X-direction periodic structures may be influenced by residual DC bias associated with the 0-order diffraction lobe 606. Similarly, the image of the Y-direction periodic structures may be influenced by residual DC bias associated with the 0-order diffraction lobe 602. In some applications, such residual DC bias may be within an operational tolerance and may be acceptable.

However, in some applications, the overlay metrology tool 102 may include one or more additional elements to remove or mitigate this residual DC bias. In some embodiments, the overlay metrology tool 102 imparts orthogonal polarizations to the illumination beams 106*a,b* (e.g., as illustrated in FIG. 5F) to provide for polarization isolation. Further, the collection pathway 134 may include, but is not required to include, one or more polarizers to isolate the diffraction lobes from the illumination beams 106*a,b*. For example, the overlay metrology tool 102 may include two collection channels and one or more polarizers (e.g., as beamsplitters 146 or other collection-pathway optics 138 in any suitable location) such that the detectors 114 in the two collection channels 144 separately image the overlay target 104 with orthogonal polarizations. By way of another example, the collection pathway 134 may include a structured image plane (e.g., field plane) polarizer providing different polarization directions in the image plane corresponding to the locations of the associated periodic features.

In some embodiments, the overlay metrology tool 102 imparts different spectral content (e.g., center wavelength, bandwidth, or the like) to the illumination beams 106*a,b* (e.g., as illustrated in FIG. 5D). In this way, the overlay metrology tool 102 may include spectral filters for isolation based on the spectral content. For example, in a configuration with two collection channels 144, dichroic beamsplitters 146 and/or different spectral filters located in the different collection channels 144 may provide separate images of the orthogonal target features.

Figure 7A:
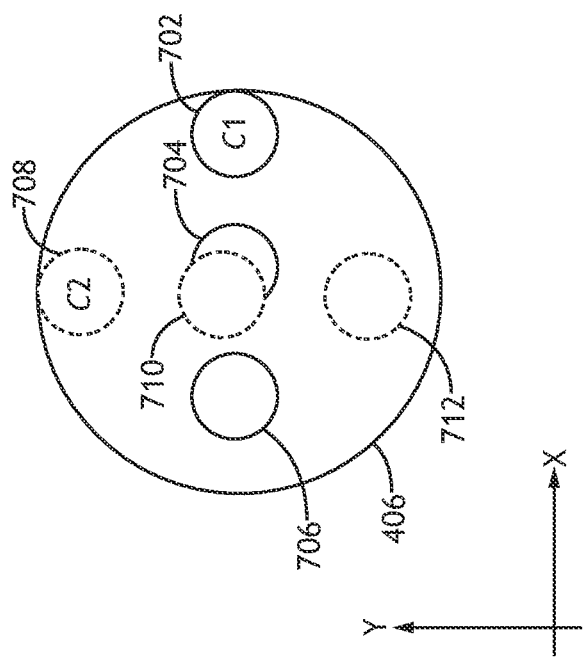
FIG. 7A is a conceptual view of a collection pupil plane illustrating a configuration of the overlay metrology tool as collected by an objective lens, in accordance with one or more embodiments of the present disclosure.

FIGS. 7A and 7B illustrate direction-isolated imaging in a dark-field imaging mode, in accordance with one or more embodiments of the present disclosure. FIG. 7A is a conceptual view of a collection pupil plane 140 illustrating a configuration of the overlay metrology tool 102 as collected by an objective lens 130, in accordance with one or more embodiments of the present disclosure. In particular, FIG. 7A illustrates a configuration of the overlay metrology tool 102 (e.g., based on a metrology recipe) in which the collection pupil plane 140 includes a 0-order diffraction lobe 702, a first-order diffraction lobe 704 and a second-order diffraction lobe 706 of the first illumination beam 106*a* by X-direction periodic structures (e.g., cells 202*b,d* in FIG. 2A), along with a 0-order diffraction lobe 708, a first-order diffraction lobe 710 and a second-order diffraction lobe 712 of the second illumination beam 106*b* by Y-direction periodic structures (e.g., cells 202*a,c* in FIG. 2A).

FIG. 7B is a conceptual view of the collection pupil plane 140 of FIG. 7A in which 0-order diffraction lobes are blocked to provide dark-field imaging, in accordance with one or more embodiments of the present disclosure. For example, FIG. 7B illustrates a blocker 714 in the collection pupil plane 140 (e.g., a part of the collection-pathway optics 138) to selectively block the 0-order diffraction lobes 702, 708. This blocker 714 may generally have any shape and may be formed from any number of elements. In this way, the particular configuration illustrated in FIG. 7B is not limiting on the present disclosure.

In this configuration, an image (or a portion thereof) of the X-direction periodic structures (e.g., cells 202*b,d* in FIG. 2A) is formed exclusively by the first illumination beam 106*a*, while an image (or a portion thereof) of the Y-direction periodic structures (e.g., cells 202*a,c* in FIG. 2A) is formed exclusively by second illumination beam 106*b*. In particular, the blocking of the 0-order diffraction lobes 702,708 eliminates any residual impact of orthogonal structures. Further, the resulting dark-field images will have full contrast (e.g., 100% contrast).

FIG. 8A is a conceptual diagram of the generation of various diffraction lobes, in accordance with one or more embodiments of the present disclosure. FIG. 8B is a conceptual view of a collection pupil plane 140 illustrating direction-isolated imaging in an optical Moiré mode based on the diffraction lobes illustrated in FIG. 8A, in accordance with one or more embodiments of the present disclosure. For example, the overlay target 104 may include grating-over-grating features with different pitches (e.g., Moiré structures) as illustrated in FIGS. 2B-2C, but including different cells 202 with Moiré structures oriented along orthogonal directions (e.g., X and Y directions). In particular, FIG. 8B illustrates a configuration of the overlay metrology tool 102 (e.g., based on a metrology recipe) in which the collection pupil plane 140 includes a 0-order diffraction lobe 802, a first-order diffraction lobe 804 of the first illumination beam 106*a* from the first set of periodic features 204 (labeled as 1) distributed along the X direction, and a first-order diffraction lobe 806 of the first illumination beam 106*a* from the second set of periodic features 206 (labeled as 1') distributed along the X direction. FIG. 8B also illustrates a 0-order diffraction lobe 808, a first-order diffraction lobe 810 of the second illumination beam 106*b* from the first set of periodic features 204 (labeled as 1) distributed along the Y direction and a first-order diffraction lobe 812 of the second illumination beam 106*b* from the second set of periodic features 206 (labeled as 1') distributed along the Y direction.

FIG. 8C is a conceptual view of a collection pupil plane 140 of FIG. 8B including a blocker 814 in the collection pupil plane 140 to selectively block the 0-order diffraction lobes 802,808, in accordance with one or more embodiments of the present disclosure. This blocker 814 may generally have any shape and may be formed from any number of elements. In this way, the particular configuration illustrated in FIG. 8 is not limiting on the present disclosure. In this configuration, an image (or a portion thereof) of the X-direction periodic structures is formed exclusively by the first illumination beam 106*a*, while an image (or a portion thereof) of the Y-direction periodic structures is formed exclusively by second illumination beam 106*b*. In particular, the blocking of the 0-order diffraction lobes 802,808 eliminates any residual impact of orthogonal structures. Further, as described previously herein, various distinguishing parameters of the illumination beams 106*a,b* such as, but not limited to, spectral content or polarization may be used to further isolate images of the X-direction and Y-direction structures in one or two collection channels 144.

Referring now generally to FIGS. 4A-8C, it is to be understood that that the illustrated imaging configurations are provided solely for illustration and should not be interpreted as limiting. For example, direction-isolated imaging may be extended to other imaging modes in which different combinations of diffraction orders per direction are utilized. By way of another example, it may be desirable to provide images with symmetric oblique illumination conditions.

Figure 9:
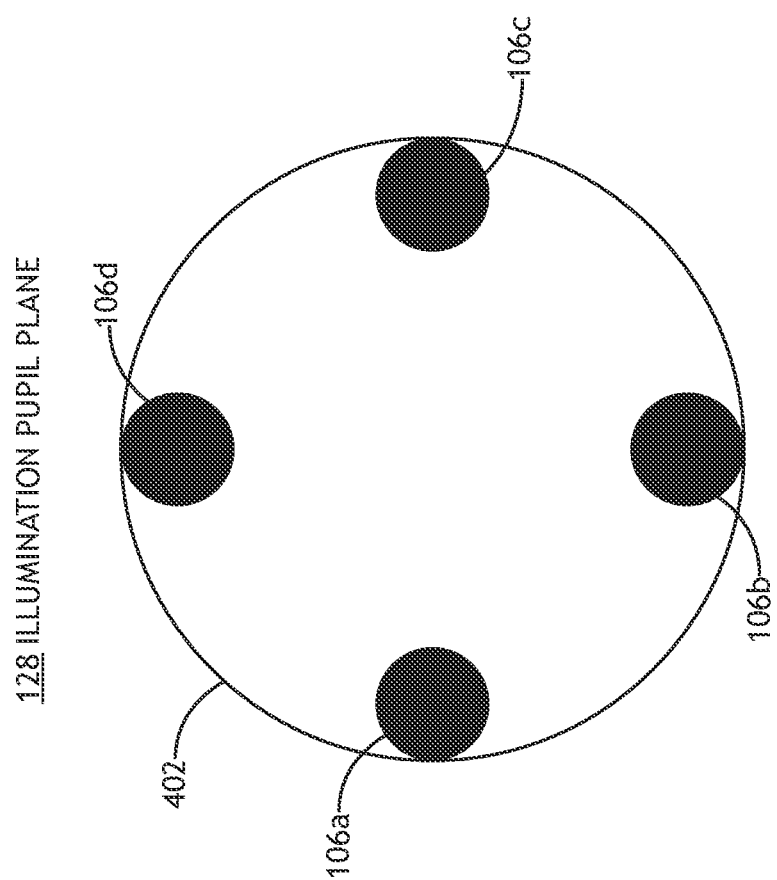
FIG. 9 is a conceptual view of an illumination pupil plane including four illumination beams positioned to provide symmetric oblique illumination along orthogonal azimuth directions, in accordance with one or more embodiments of the present disclosure.

FIG. 9 is a conceptual view of an illumination pupil plane 128 including four illumination beams 106a,b,c,d positioned to provide symmetric oblique illumination along orthogonal azimuth directions, in accordance with one or more embodiments of the present disclosure. For example, FIG. 9 may represent a symmetric variation of the illumination distribution of FIG. 4A.

In some embodiments, an overlay target 104 is illuminated with all four illumination beams 106a,b,c,d simultaneously, where direction-isolated images are generated in one or more collection channels 144 as disclosed herein. For example, the oblique bright-field imaging mode illustrated in FIG. 6 may be suitable for, but is not limited to, simultaneous illumination with illumination beams 106a,b,c,d.

In some embodiments, an overlay target 104 is illuminated sequentially with symmetrically-opposed illumination beams 106. For example, the overlay target 104 may be first illuminated with illumination beams 106a,b to form a first set of direction-isolated images in one or more collection channels 144 and then illuminated with illumination beams 106c,d to form a second set of direction-isolated images in one or more collection channels 144. The resulting images may then be analyzed together to provide an overlay measurement.

Referring now again to FIGS. 1A and 1B, various additional components of the overlay metrology system 100 are described in greater detail, in accordance with one or more embodiments of the present disclosure.

The illumination source 108 may include any type of illumination source suitable for providing at least one illumination beam 106. In one embodiment, the illumination source 108 is a laser source. For example, the illumination source 108 may include, but is not limited to, one or more narrowband laser sources, a broadband laser source, a supercontinuum laser source, a white light laser source, or the like. In this regard, the illumination source 108 may provide an illumination beam 106 having high coherence (e.g., high spatial coherence and/or temporal coherence). In another embodiment, the illumination source 108 includes a laser-sustained plasma (LSP) source. For example, the illumination source 108 may include, but is not limited to, an LSP lamp, an LSP bulb, or an LSP chamber suitable for containing one or more elements that, when excited by a laser source into a plasma state, may emit broadband illumination. In another embodiment, the illumination source 108 includes a lamp source. For example, the illumination source 108 may include, but is not limited to, an arc lamp, a discharge lamp, an electrode-less lamp, or the like. In this regard, the illumination source 108 may provide an illumination beam 106 having low coherence (e.g., low spatial coherence and/or temporal coherence).

The overlay metrology tool 102 may generate two or more illumination beams 106 using any technique known in the art. Further, the illumination beams 106 may be arranged in any arrangement including, but not limited to, dipole illumination, quadrature illumination, or the like.

In some embodiments, the illumination source 108 directly generates two or more illumination beams 106. In some embodiments, the overlay metrology tool 102 includes two or more apertures in an illumination pupil plane 128 (e.g., illumination-pathway optics 126) to divide illumination from the illumination source 108 into the two or more illumination beams 106 or illumination lobes. Further, the spatial profile of the one or more illumination beams 106 on the sample 110 may be controlled by a field-plane stop to have any selected spatial profile.

In some embodiments, the illumination source 108 provides light in two or more optical fibers, where light output from each optical fiber is an illumination lobe of the illumination beam 106. For example, output faces of the optical fibers may be in or imaged to the illumination pupil plane 128. In some embodiments, the overlay metrology tool 102 diffracts illumination from the illumination source 108 into two or more diffraction orders, where the illumination beams 106 are formed from at least some of the diffraction orders of the light source. Efficient generation of multiple illumination lobes through controlled diffraction is generally described in U.S. Pat. No. 11,118,903 issued on Sep. 14, 2021 and titled EFFICIENT ILLUMINATION SHAPING FOR SCATTEROMETRY OVERLAY, which is incorporated herein by reference in its entirety.

The overlay metrology tool 102 may generally include any number or type of detectors 114 suitable for capturing light from the sample 110 indicative of overlay. In one embodiment, the detector 114 includes one or more detectors 114 suitable for characterizing a static sample. In this regard, the overlay metrology tool 102 may operate in a static mode in which the sample 110 is static during a measurement. For example, a detector 114 may include a two-dimensional pixel array such as, but not limited to, a charge-coupled device (CCD) or a complementary metal-oxide semiconductor (CMOS) device. In this regard, the detector 114 may generate a two-dimensional image in a single measurement. In one embodiment, the detector 114 includes one or more detectors 114 suitable for characterizing a moving sample (e.g., a scanned sample) such as, but not limited to, a 2D pixel array, a time-delay integration (TDI) detector, or the like. In this regard, the overlay metrology tool 102 may operate in a scanning mode in which the sample 110 is scanned with respect to a measurement field during a measurement.

In another embodiment, the overlay metrology tool 102 includes a scanning sub-system to scan the sample 110 with respect to the measurement field during a metrology measurement. For example, the sample stage 132 may position and orient the sample 110 within a focal volume of the objective lens 130. In another embodiment, the sample stage 132 includes one or more adjustable stages such as, but not limited to, a linear translation stage, a rotational stage, or a tip/tilt stage. In another embodiment, though not shown, the scanning sub-system includes one or more beam-scanning optics (e.g., rotatable mirrors, galvanometers, or the like) to scan the illumination beam 106 with respect to the sample 110).

FIG. 10 is a flow diagram illustrating steps performed in a method 1000 for direction-isolated imaging, in accordance with one or more embodiments of the present disclosure. Applicant notes that the embodiments and enabling technologies described previously herein in the context of the overlay metrology system 100 should be interpreted to extend to the method 1000. It is further noted, however, that the method 1000 is not limited to the architecture of the overlay metrology system 100.

In some embodiments, the method 1000 includes a step 1002 of illuminating an overlay target on a sample with one or more first illumination beams and one or more second illumination beams, where the overlay target includes first-direction periodic features in a first set of layers of the sample distributed along a first measurement direction and second-direction periodic features in a second set of layers of the sample distributed along a second measurement direction different than the first measurement direction. In this way, the overlay target may generate diffraction lobes of the first and second illumination beams in both X and Y directions. The step 1002 may additionally include illuminating the overlay target with the first and second illumination beams simultaneously.

The overlay target may generally include any overlay target design known suitable for image-based diffraction. For example, the overlay target may include, but is not limited to, an Advanced Imaging Metrology (AIM) target, a triple AIM target having features on three layers, a robust AIM (rAIM) target including one or more Moiré structures, or the like. Further, the overlay target may include periodic features in any number of layers, where the periodic features in one measurement direction (e.g., the X direction) need not be in the same layers as periodic features in another measurement direction (e.g., the Y direction).

In some embodiments, the method 1000 includes a step 1004 of generating, with one or more collection optics, one or more images of the overlay target on one or more detectors based on diffraction of the one or more first illumination beams and the one or more second illumination beams by the overlay target, where diffraction orders of the one or more first illumination beams contribute to resolved image formation of only the first set of periodic features, and where diffraction orders of the one or more second illumination beams contribute to resolved image formation of only the second set of periodic features. In some embodiments, the collection optics, the overlay target, and the first and second illumination beams may be configured (e.g., according to a metrology recipe) such that diffraction orders of the first illumination beams by the first-direction periodic features are collected, but diffraction orders of the first illumination beams by the second-direction periodic features are not collected (e.g., lie outside an NA of the collection optics, outside a boundary of a collection pupil, or the like). Similarly, the collection optics, the overlay target, and the first and second illumination beams may be configured (e.g., according to a metrology recipe) such that diffraction orders of the second illumination beams by the first-direction periodic features are not collected, but diffraction orders of the second illumination beams by the second-direction periodic features are collected. In this way, the first-direction periodic structures are resolvable only based on diffraction of the first illumination beams, while the second-direction periodic structures are resolvable only based on diffraction of the second illumination beams.

In some embodiments, the method 1000 includes a step 1006 of generating a first overlay measurement along the first measurement direction based on the one or more images. For example, the step 1006 may include generating an overlay measurement based on the resolved first-direction periodic features based on the first illumination beams. In some embodiments, the method 1000 includes a step 1008 of generating a second overlay measurement along the second measurement direction based on the one or more images. For example, the step 1008 may include generating an overlay measurement based on the resolved second-direction periodic features based on the second illumination beams.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An optical metrology system comprising:
  an overlay metrology tool configurable to implement a metrology recipe for characterizing an overlay target on a sample, wherein the overlay target in accordance with the metrology recipe includes first-direction periodic features in a first set of layers of the sample, the first-direction periodic features distributed along a first measurement direction, wherein the overlay target, in accordance with the metrology recipe, further includes second-direction periodic features in a second set of layers of the sample, the second-direction periodic features distributed along a second measurement direction different than the first measurement direction, wherein the overlay metrology tool in accordance with the metrology recipe comprises:
    one or more illumination optics configurable to illuminate the overlay target with one or more first illumination beams and one or more second illumination beams, wherein at least one of the first illumination beams and at least one of the second illumination beams are incident on the overlay target simultaneously; and
    one or more collection optics configurable to generate one or more images of the overlay target on one or more detectors based on diffraction of the one or more first illumination beams and the one or more second illumination beams by the overlay target, wherein diffraction orders of the one or more first illumination beams contribute to resolved image formation of only the first-direction periodic features, wherein diffraction orders of the one or more second illumination beams contribute to resolved image formation of only the second-direction periodic features; and
  a controller communicatively coupled to the one or more detectors, the controller including one or more processors configured to execute program instructions causing the one or more processors to:

generate a first overlay measurement along the first measurement direction based on the one or more images; and
generate a second overlay measurement along the second measurement direction based on the one or more images.

2. The optical metrology system of claim 1, wherein the first illumination beams and the second illumination beams are differentiated by azimuth incidence angle on the overlay target and at least one of altitude incidence angle on the overlay target, wavelength, bandwidth, polarization, intensity, numerical aperture in an illumination pupil of the one or more illumination optics, lobe shape in the illumination pupil, or obliquity.

3. The optical metrology system of claim 1, wherein the first illumination beams include a single first illumination beam providing a first azimuth incidence angle on the overlay target, wherein the second illumination beams include a single second illumination beam providing a second azimuth incidence angle on the overlay target.

4. The optical metrology system of claim 3, wherein the first and second azimuth incidence angles are orthogonal.

5. The optical metrology system of claim 1, wherein the first illumination beams include a first set of two illumination beams providing a first set of symmetrically opposed azimuth incidence angles on the overlay target, wherein the second illumination beams include a second set of two illumination beams providing a second set of symmetrically opposed azimuth incidence angles on the overlay target.

6. The optical metrology system of claim 5, wherein the first and second sets of azimuth incidence angles are orthogonal.

7. The optical metrology system of claim 5, wherein the one or more illumination optics, when implementing the metrology recipe, direct the first set of two illumination beams and the second set of two illumination beams to the overlay target simultaneously.

8. The optical metrology system of claim 5, wherein the one or more illumination optics direct one of the first set of two illumination beams and one of the second set of two illumination beams to the overlay target as a first exposure, wherein the one or more illumination optics direct another of the first set of two illumination beams and another of the second set of two illumination beams to the overlay target as a second exposure.

9. The optical metrology system of claim 1, wherein the one or more collection optics include a single collection channel, wherein the one or more detectors includes a single detector.

10. The optical metrology system of claim 1, wherein the one or more collection optics include two collection channels, wherein the one or more detectors include two detectors, wherein each of the two collection channels includes one of the two detectors, wherein the one or more collection optics separate the diffraction orders from the first illumination beams into a first of the two collection channels and the diffraction orders from the second illumination beams into a second of the two collection channels, wherein the first of the two collection channels provides one or more images of the overlay target in which only the first-direction periodic features are resolved, wherein the second of the two collection channels provides one or more images of the overlay target in which only the second-direction periodic features are resolved.

11. The optical metrology system of claim 1, wherein, in accordance with the metrology recipe, the overlay metrology tool exclusively collects:

two or more diffraction lobes along the first measurement direction generated by the first-direction periodic features from each of the one or more first illumination beams; and
two or more diffraction lobes along the second measurement direction generated by the second-direction periodic features from each of the one or more second illumination beams.

12. The optical metrology system of claim 1, wherein, in accordance with the metrology recipe, the overlay metrology tool exclusively collects:
a 0-order diffraction lobe and a first-order diffraction lobe along the first measurement direction generated by the first-direction periodic features from each of the one or more first illumination beams; and
a 0-order diffraction lobe and a first-order diffraction lobe along the second measurement direction generated by the second-direction periodic features from each of the one or more second illumination beams,
wherein one or more images of the overlay target are oblique bright-field images.

13. The optical metrology system of claim 1, wherein, in accordance with the metrology recipe, the overlay metrology tool exclusively collects:
a 0-order diffraction lobe, a first-order diffraction lobe, and a second-order diffraction lobe along the first measurement direction generated by the first-direction periodic features from each of the one or more first illumination beams; and
a 0-order diffraction lobe, a first-order diffraction lobe, and a second-order diffraction lobe along the second measurement direction generated by the second-direction periodic features from each of the one or more second illumination beams,
wherein the one or more collection optics include one or more elements to block the 0-order diffraction lobes along the first and second measurement directions, wherein one or more images of the overlay target are dark-field images.

14. The optical metrology system of claim 1, wherein the first-direction periodic features include gratings with a first pitch and a second pitch distributed along the first measurement direction to form a first-direction Moiré structure, wherein the second-direction periodic features include gratings with the first pitch and the second pitch distributed along the second measurement direction to form a second-direction Moiré structure, wherein, in accordance with the metrology recipe, the overlay metrology tool exclusively collects:
a 0-order diffraction lobe, a first-order diffraction lobe from the gratings with the first pitch in the first-direction Moiré structure, and a first-order diffraction lobe from the gratings with the second pitch in the first-direction Moiré structure associated with each of the one or more first illumination beams; and
a 0-order diffraction lobe, a first-order diffraction lobe from the gratings with the first pitch in the second-direction Moiré structure, and a first-order diffraction lobe from the gratings with the second pitch in the second-direction Moiré structure associated with each of the one or more second illumination beams.

15. The optical metrology system of claim 14, wherein the one or more collection optics further include one or more elements to block the 0-order diffraction lobes along the first and second measurement directions.

16. The optical metrology system of claim 1, wherein the overlay target comprises:

at least one of an advanced imaging metrology (AIM) target, a triple AIM target, or a robust AIM (rAIM) target.

17. The optical metrology system of claim 1, wherein the first and second sets of sample layers are a common set of sample layers.

18. The optical metrology system of claim 1, wherein the first set of sample layers is different than the second set of sample layers.

19. The optical metrology system of claim 18, wherein the first set of sample layers includes a first layer of the sample and a second layer of the sample, wherein the second set of sample layers includes the first layer of the sample and a third layer of the sample.

20. The optical metrology system of claim 1, wherein at least one of the first or second-direction periodic features includes features associated with different lithographic exposures on a single layer.

21. An optical metrology system comprising:
one or more illumination optics configurable to illuminate an overlay target on a sample with one or more first illumination beams and one or more second illumination beams when implementing a metrology recipe, wherein at least one of the first illumination beams and at least one of the second illumination beams are incident on the overlay target simultaneously, wherein the overlay target in accordance with the metrology recipe includes first-direction periodic features in a first set of layers of the sample, the first-direction periodic features distributed along a first measurement direction, wherein the overlay target in accordance with the metrology recipe further includes second-direction periodic features in a second set of layers of the sample, the second-direction periodic features distributed along a second measurement direction different than the first measurement direction;
one or more collection optics configurable to generate one or more images of the overlay target on one or more detectors based on diffraction of the one or more first illumination beams and the one or more second illumination beams by the overlay target when implementing the metrology recipe, wherein diffraction orders of the one or more first illumination beams contribute to resolved image formation of only the first-direction periodic features, wherein diffraction orders of the one or more second illumination beams contribute to resolved image formation of only the second-direction periodic features; and
a controller communicatively coupled to the one or more detectors, the controller including one or more processors configured to execute program instructions causing the one or more processors to:
generate a first overlay measurement along the first measurement direction based on the one or more images; and
generate a second overlay measurement along the second measurement direction based on the one or more images.

22. An optical metrology method comprising:
illuminating an overlay target on a sample with one or more first illumination beams and one or more second illumination beams, wherein at least one of the first illumination beams and at least one of the second illumination beams are incident on the overlay target simultaneously, wherein the overlay target in accordance with a metrology recipe includes first-direction periodic features in a first set of layers of the sample, the first-direction periodic features distributed along a first measurement direction, wherein the overlay target in accordance with the metrology recipe further includes second-direction periodic features in a second set of layers of the sample, the second-direction periodic features distributed along a second measurement direction different than the first measurement direction;
generating one or more images of the overlay target on one or more detectors based on diffraction of the one or more first illumination beams and the one or more second illumination beams by the overlay target, wherein diffraction orders of the one or more first illumination beams contribute to resolved image formation of only the first-direction periodic features, wherein diffraction orders of the one or more second illumination beams contribute to resolved image formation of only the second-direction periodic features;
generating a first overlay measurement along the first measurement direction based on the one or more images; and
generating a second overlay measurement along the second measurement direction based on the one or more images.

23. The optical metrology method of claim 22, wherein the first illumination beams and the second illumination beams are differentiated by azimuth incidence angle on the overlay target and at least one of altitude incidence angle on the overlay target, wavelength, bandwidth, polarization, intensity, numerical aperture in an illumination pupil of one or more illumination optics, lobe shape in the illumination pupil, or obliquity.

24. The optical metrology method of claim 22, wherein the first illumination beams include a single first illumination beam providing a first azimuth incidence angle on the overlay target, wherein the second illumination beams include a single second illumination beam providing a second azimuth incidence angle on the overlay target.

25. The optical metrology method of claim 22, wherein the first illumination beams include a first set of two illumination beams providing a first set of symmetrically opposed azimuth incidence angles on the overlay target, wherein the second illumination beams include a second set of two illumination beams providing a second set of symmetrically opposed azimuth incidence angles on the overlay target.

26. The optical metrology method of claim 25, wherein illuminating the overlay target on a sample with the one or more first illumination beams and the one or more second illumination beams comprises:
directing the first set of two illumination beams and the second set of two illumination beams to the overlay target simultaneously.

27. The optical metrology method of claim 25, wherein illuminating the overlay target on a sample with one or more first illumination beams and one or more second illumination beams comprises:
directing one of the first set of two illumination beams and one of the second set of two illumination beams to the overlay target as a first exposure; and
directing another of the first set of two illumination beams and another of the second set of two illumination beams to the overlay target as a second exposure.

28. The optical metrology method of claim 23, wherein generating, with one or more collection optics, one or more images of the overlay target on the one or more detectors based on the diffraction of the one or more first illumination beams and the one or more second illumination beams by the overlay target comprises:

generating the one or more images of the overlay target exclusively with:

two or more diffraction lobes along the first measurement direction generated by the first-direction periodic features from each of the one or more first illumination beams; and two or more diffraction lobes along the second measurement direction generated by the second-direction periodic features from each of the one or more second illumination beams.

29. The optical metrology method of claim 23, wherein generating, with one or more collection optics, one or more images of the overlay target on one or more detectors based on diffraction of the one or more first illumination beams and the one or more second illumination beams by the overlay target comprises:

generating the one or more images of the overlay target exclusively with:

a 0-order diffraction lobe and a first-order diffraction lobe along the first measurement direction generated by the first-direction periodic features from each of the one or more first illumination beams; and a 0-order diffraction lobe and a first-order diffraction lobe along the second measurement direction generated by the second-direction periodic features from each of the one or more second illumination beams, wherein the one or more images of the overlay target are oblique bright-field images.

30. The optical metrology method of claim 23, wherein generating, with one or more collection optics, one or more images of the overlay target on one or more detectors based on diffraction of the one or more first illumination beams and the one or more second illumination beams by the overlay target comprises:

generating the one or more images of the overlay target exclusively with:

a 0-order diffraction lobe, a first-order diffraction lobe, and a second-order diffraction lobe along the first measurement direction generated by the first-direction periodic features from each of the one or more first illumination beams; and a 0-order diffraction lobe, a first-order diffraction lobe, and a second-order diffraction lobe along the second measurement direction generated by the second-direction periodic features from each of the one or more second illumination beams, wherein the one or more collection optics include one or more elements to block the 0-order diffraction lobes along the first and second measurement directions, wherein one or more images of the overlay target are dark-field images.

31. The optical metrology method of claim 23, wherein the first-direction periodic features include gratings with a first pitch and a second pitch distributed along the first measurement direction to form a first-direction Moiré structure, wherein the second-direction periodic features include gratings with the first pitch and the second pitch distributed along the second measurement direction to form a second-direction Moiré structure, wherein generating, with one or more collection optics, one or more images of the overlay target on one or more detectors based on diffraction of the one or more first illumination beams and the one or more second illumination beams by the overlay target comprises:

generating the one or more images of the overlay target exclusively with:

a 0-order diffraction lobe, a first-order diffraction lobe from the gratings with the first pitch in the first-direction Moiré structure, and a first-order diffraction lobe from the gratings with the second pitch in the first-direction Moiré structure associated with each of the one or more first illumination beams; and a 0-order diffraction lobe, a first-order diffraction lobe from the gratings with the first pitch in the second-direction Moiré structure, and a first-order diffraction lobe from the gratings with the second pitch in the second-direction Moiré structure associated with each of the one or more second illumination beams.

* * * * *